United States Patent [19]
Kweon et al.

[11] Patent Number: 5,900,676
[45] Date of Patent: May 4, 1999

[54] SEMICONDUCTOR DEVICE PACKAGE STRUCTURE HAVING COLUMN LEADS AND A METHOD FOR PRODUCTION THEREOF

[75] Inventors: Young Do Kweon, Seoul; Kyu Jin Lee; Wan Gyan Choi, both of Kyungki-do, all of Rep. of Korea

[73] Assignee: Samsung Electronics Co., Ltd., Suwon, Rep. of Korea

[21] Appl. No.: 08/914,233

[22] Filed: Aug. 19, 1997

[30] Foreign Application Priority Data

Aug. 19, 1996 [KR] Rep. of Korea .................. 1996-34275

[51] Int. Cl.[6] .................................................. H01L 23/28
[52] U.S. Cl. .......................... 257/787; 257/296; 257/666
[58] Field of Search .................................... 257/666, 787, 257/796, 780, 781, 786

[56] References Cited

U.S. PATENT DOCUMENTS

| | | | |
|---|---|---|---|
| 3,781,596 | 12/1973 | Galli et al. | 257/766 |
| 5,157,475 | 10/1992 | Yamaguchi | 257/787 |
| 5,302,849 | 4/1994 | Cavasin | 257/787 |
| 5,309,429 | 5/1994 | Fujimaki et al. | 257/796 |
| 5,373,190 | 12/1994 | Ichiyama | 257/787 |
| 5,521,429 | 5/1996 | Aono et al. | 257/796 |
| 5,554,887 | 9/1996 | Sawai et al. | 257/787 |
| 5,581,444 | 12/1996 | Furino et al. | 257/796 |
| 5,659,200 | 8/1997 | Sono et al. | 257/796 |
| 5,849,608 | 12/1998 | Abe . | |

*Primary Examiner*—Carl Whitehead, Jr.
*Assistant Examiner*—S. V. Clark
*Attorney, Agent, or Firm*—Jones, Volentine, Steinberg, & Whitt, LLP

[57] ABSTRACT

A semiconductor device package contains column leads which are electrically connected to a chip. The column leads, chip and electrical connection means are encapsulated to form a package body, from which the column leads extend for connection to a substrate such as a printed circuit board. A lead frame for the column leads can be formed by etching the column leads and a die pad out of a section of column lead material with a polyimide layer backing. Alternatively, a lead frame having parallel side rails on either side of a die pad can be used as an assembly frame for rows of column leads. Mass production of this package body using either type of lead frame produces high reliability packages in a simple and cost-effective way.

13 Claims, 33 Drawing Sheets

SEMICONDUCTOR DEVICE PACKAGE STRUCTURE HAVING COLUMN LEADS AND A METHOD FOR PRODUCTION THEREOF

BACKGROUND OF THE INVENTION

1. Field of the Invention

The present invention relates generally to a chip scale package and a method for manufacturing it. More particularly, the present invention relates to a semiconductor chip package having column leads, the column leads being electrically connected to a respective one of a corresponding set of bonding pads on a chip and extending outward from the package body. The present invention also relates to a lead frame for manufacturing the package, and to a manufacturing method thereof.

2. Background of the Related Art

As semiconductor chips have become more highly integrated and the number of input/output pads per chip has increased, the need for smaller semiconductor chip packages has also increased. Accordingly, various packaging technologies have been developed to address this need. For example, COB (chip on board) or flip chip technology allows a direct mounting of the chip onto a printed circuit board (PCB).

However, since the chip is mounted onto the PCB without carrying out reliability tests such as a bum-in test, the electronic systems into which the PCB is installed can have a defective chip. This is a drawback of these packaging technologies, because any defective chip must be repaired or replaced with a good one, after only a short period of use, and only with difficulty.

Accordingly, there still is a need to assure reliability of the package while minimizing package size to almost the same size as the chip itself. Recently, a chip-scale package (CSP) has been developed to address this need. The CSP provides advantages in that it is supplied to the end users as a known good die and can be mounted onto the PCB by employing conventional surface mount technology, allowing miniaturization and multi-functionalization of electronic systems, while retaining a size as small as a bare chip.

Nevertheless, the cost of manufacturing the CSP is relatively high, both for purchasing new equipment for production thereof, and for fabrication of individual packages.

SUMMARY OF THE INVENTION

It is therefore an object of the present invention to provide improved chip scale packages for semiconductor chips, and the related methods and assemblies thereof.

It is another object of the present invention to provide chip scale packages and methods, which allow a reduction in the production cost and improvements in reliability of the packages.

These and other objects of the present invention can be accomplished by semiconductor chip packages including a plurality of column leads.

In particular, a package according to the present invention comprises: a chip having a plurality of bonding pads on an upper surface thereof; a die pad having a metal layer coated on an upper surface thereof and being bonded to a bottom surface of the chip; a plurality of column leads, which are separated from the die pad and have a metal layer formed on an upper surface thereof; means for electrically connecting each of the bonding pads to the metal layer formed on a corresponding one of the column leads; and an encapsulant covering the chip, the die pad, the column leads and the electrical connection means, wherein a bottom portion of each of the column leads and a bottom portion of the die pad extends outward from the encapsulant.

According to another aspect of the present invention, a method is provided for manufacturing a semiconductor device package including a plurality of column leads. This method comprises the steps of:

(a) preparing a column lead material having a polyimide film on a bottom surface thereof; (b) etching the column lead material to form a die pad and a plurality of column leads on the polyimide film, the column leads being separated from the die pad; (c) forming a metal layer on an upper surface of each column lead, on an upper surface of the die pad and on an exposed upper surface of the polyimide film not covered by the die pad or the column leads; (d) attaching the chip to the metal layer on the die pad, an attachment being made between a bottom surface of the chip where no bonding pad is provided and an upper surface of the metal layer; (e) electrically connecting each of the bonding pads to a corresponding one of the metal layers on the column leads; (f) encapsulating the chip, the die pad, the column leads, the electrical connections and the upper surface of the polyimide film with an encapsulant to give a package body; and (g) removing said polyimide film to give a package having said column leads and die pads extending outward from the package body.

According to still another aspect of the present invention, a lead frame for semiconductor packages is provided. The lead frame comprises: a die pad; two parallel side rails on opposite sides of the die pad, each of the side rails being formed with a plurality of index holes and a plurality of through holes; tie bars linking the die pad to the side rails; column lead groups further comprising contacting column leads, linking column leads and a band; and two dam bars located outside of the groups of column leads and integral with the side rails.

For this embodiment, the column lead groups are disposed on opposite sides of the die pad perpendicular to the side rails. The contacting column leads and linking column leads are in a row in such a way that the linking column leads are placed at outermost positions in the row. The contacting column leads and linking column leads have horizontal grooves at a middle position of walls thereof. The linking column leads have a projection on their top, which is mechanically linked to a corresponding through hole in the side rails. The band ties the contacting column leads and linking column leads together, and is in contact with the grooves of the contacting and linking column leads.

According to still another aspect of the present invention, a package having column leads is provided, the package comprising: a chip having a plurality of bonding pads on an upper surface thereof; a die pad bonded to a bottom surface of the chip; contacting column lead groups disposed on opposite sides of the die pad perpendicular to the side rails and having horizontal grooves at a middle position of walls thereof; bands in contact with the grooves of the contacting column leads for connecting the contacting column leads together; means for electrically connecting each of the bonding pads to a corresponding one of the contacting column leads; and an encapsulant covering the chip, the die pad, the contacting column leads, the bands and the electrical connection means, wherein the contacting column leads and the die pad extend outward from the encapsulant.

BRIEF DESCRIPTION OF THE ATTACHED DRAWINGS

These and various other features and advantages of the present invention will be readily understood with reference to the following detailed description taken in conjunction with the accompanying drawings, wherein like reference numerals designate like structural elements, and, in which:

FIGS. 1 through 12 show a first embodiment of the present invention at various points in the manufacturing process thereof, wherein, FIG. 1 is a perspective view of a column lead material;

FIG. 2 is a perspective view of the column lead material in FIG. 1, which is coated with polyimide film;

FIG. 3 is a perspective view depicting the column lead material of FIG. 2, which is etched to have column leads and a die pad;

FIG. 4 is a perspective view of the column lead material in FIG. 3, which has a metal layer formed thereon;

FIG. 5 is a sectional view taken along the line 5—5 in FIG. 4;

FIG. 6 is a perspective view showing the column lead material in FIG. 4, in which the die pad is coated with an adhesive;

FIG. 7 is a perspective view depicting the attachment of the chip to the die pad of FIG. 6;

FIG. 8 is a perspective view depicting the electrical connections between the column leads and the chip of FIG. 7;

FIG. 9 is a perspective view of the package in FIG. 8 after molding is completed;

FIG. 10 is a sectional view taken along the line 10—10 in FIG. 9;

FIG. 11 shows a removal of the polyimide film and metal layer from the package assembly in FIG. 10 to give a package;

FIG. 12 is a sectional view taken along the line 12—12 in FIG. 11;

FIGS. 16 through 28 show a second embodiment of the present invention at various points in the manufacturing process thereof, wherein, FIG. 16 is a perspective view of a column lead material;

FIG. 17 is a perspective view of the column lead material in FIG. 16, which is coated with a polyimide film;

FIG. 18 is a perspective view depicting the column lead material, which is etched to have column leads and a die pad;

FIG. 19 is a perspective view depicting the column lead material, in which the die pads are etched to have a height half their original height;

FIG. 20 is a perspective view showing the column lead material structure in FIG. 19 in which a metal layer in formed thereon;

FIG. 21 is a sectional view taken along the line 21—21 in FIG. 20;

FIG. 22 is a perspective view showing the column lead material in FIG. 20, in which the die pad is coated with an adhesive;

FIG. 23 is a perspective view depicting the attachment of the chip to the die pad of FIG. 22;

FIG. 24 is a perspective view depicting the electrical connections between the column leads and the chip of FIG. 23;

FIG. 25 is a perspective view of the package in FIG. 24 after molding is completed;

FIG. 26 is a sectional view taken along the line 26—26 in FIG. 25;

FIG. 27 shows a removal of the polyimide film and metal layer from the package assembly in FIG. 25 to give a package;

FIG. 28 is a sectional view taken along the line 28—28 in FIG. 27;

FIGS. 32 through 45 show a third embodiment of the present invention at various points in the manufacturing process thereof, wherein, FIG. 32 is a perspective view depicting a lead frame strip employed for manufacturing a package having column leads;

FIG. 33 shows a group of column leads;

FIG. 34 is a sectional view taken along the line 34—34 in FIG. 33;

FIG. 35 is a sectional view taken along the line 35—35 in FIG. 33;

FIG. 36 is a perspective view showing a linking of the column lead group of FIG. 33 to the lead frame;

FIG. 37 is a perspective view showing a riveting of the linking column leads of FIG. 36 to the lead frame;

FIG. 38 is an enlarged view of the part 'A' in FIG. 37;

FIG. 39 is a perspective view showing the column lead material in FIG. 38, in which the die pad is coated with an adhesive;

FIG. 40 is a perspective view depicting the attachment of the chip to the die pad of FIG. 39;

FIG. 41 is a perspective view depicting the electrical connections between the column leads and the chip of FIG. 40;

FIG. 42 is a perspective view showing cutting of a band which ties the linking column leads and contacting column leads together;

FIG. 43 is a perspective view of the package in FIG. 42 after molding is completed;

FIG. 44 shows a separation of an individual package from the lead frame; and

FIG. 45 is a sectional view taken along the line 45—45 in FIG. 44.

DETAILED DESCRIPTION OF PREFERRED EMBODIMENT

Figure 1:
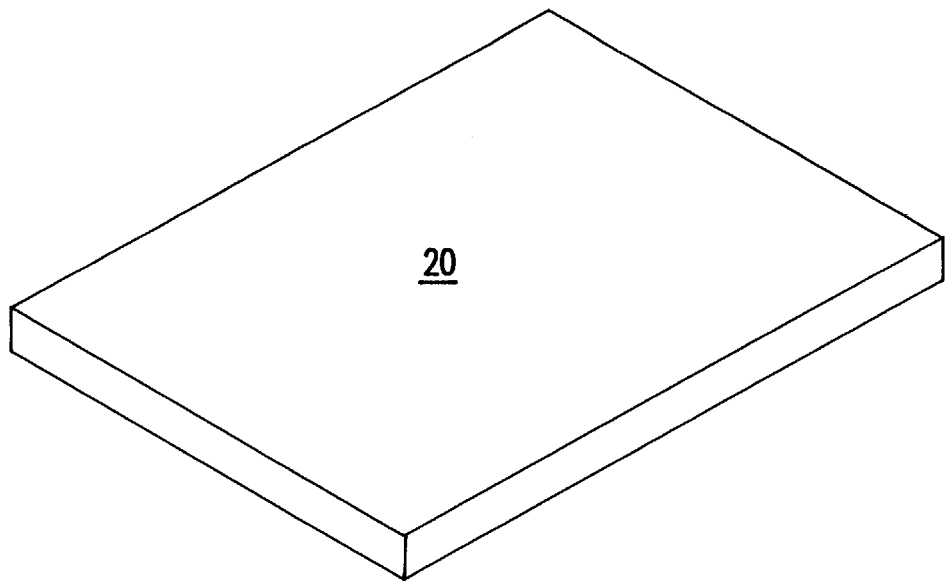

The present invention will now be described in more detail hereinafter with reference to the accompanying drawings, in which the preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions is exaggerated for clarity. Like numbers refer to like elements throughout.

The term "column lead(s)" employed throughout the application means that the lead which constitutes a feature of the present invention has a column shape instead of the long strip shape of conventional leads, and is used to only explain the shape of the lead and does not limit the scope of the present invention in any way.

Figure 2:
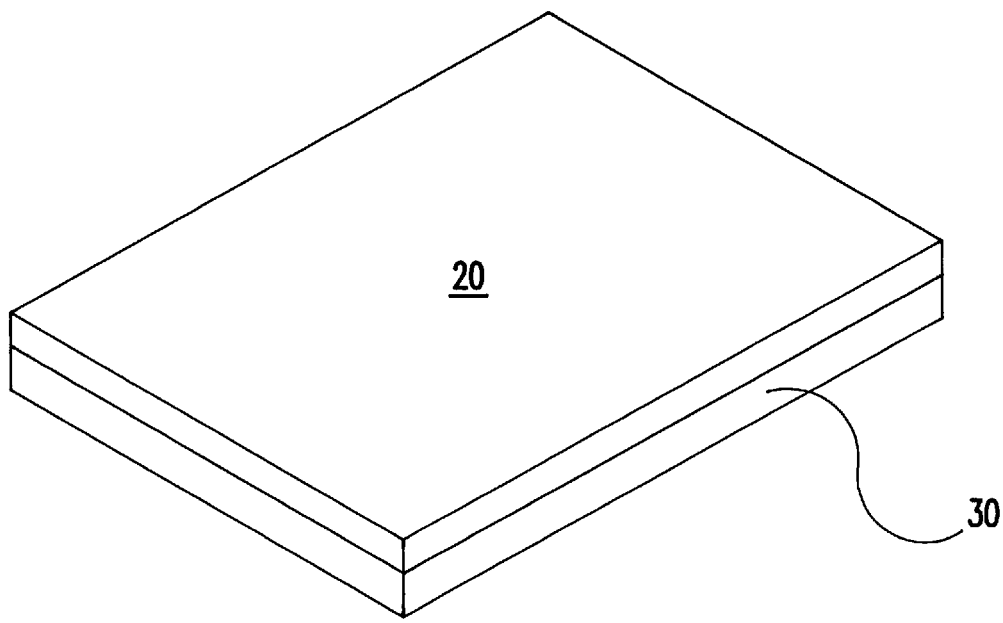

A first embodiment of the present invention will be described with reference to FIGS. 1–12. FIG. 1 is a perspective view of a column lead material; FIG. 2 is a perspective view of the column lead material in FIG. 1, which is coated with polyimide film; and FIG. 3 is a perspective view depicting the column lead material, which is etched to have column leads and a die pad.

Figure 3:
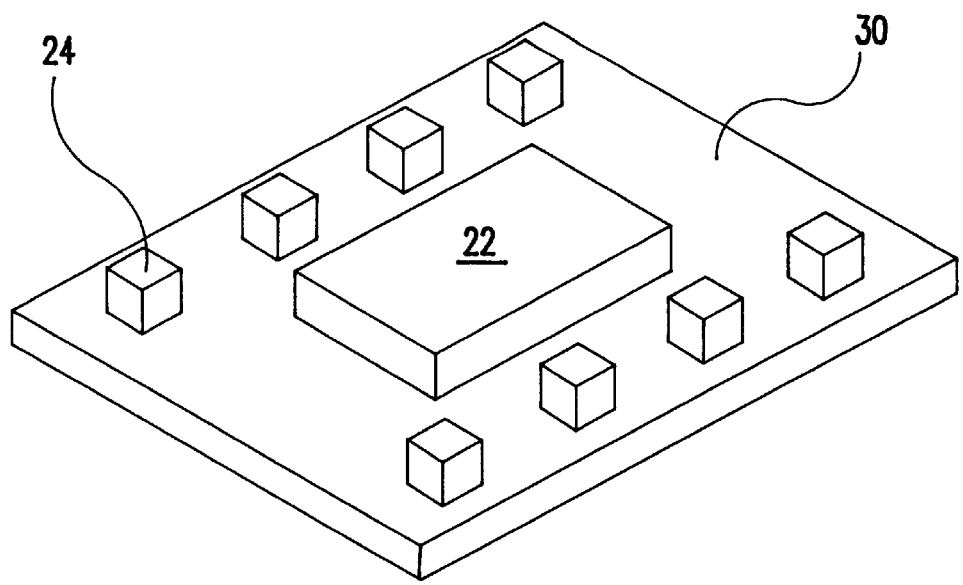

With reference to FIGS. 1 through 3, a column lead material 20 is prepared in order to manufacture a package having column leads. The column lead material 20 can be made from electrically conductive metals such as a copper or a copper alloy. Liquid polyimide is applied onto the bottom surface of the column lead material 20 and a curing is carried out to form an even polyimide film 30. The thickness of the polyimide film 30 is smaller than that of the column lead material 20. The reason therefore will be described hereinafter.

The column lead material 20 is then etched to form column leads 24 and a die pad 22. The column leads 24 will be electrically connected to a respective one of a group of bonding pads of a chip; and the die pad 22 will be attached to the chip. The die pad 22 is formed at the center region of the column lead material 20, while a plurality of column leads 24 are formed in two parallel rows on opposite sides of the die pad 22.

Figure 4:
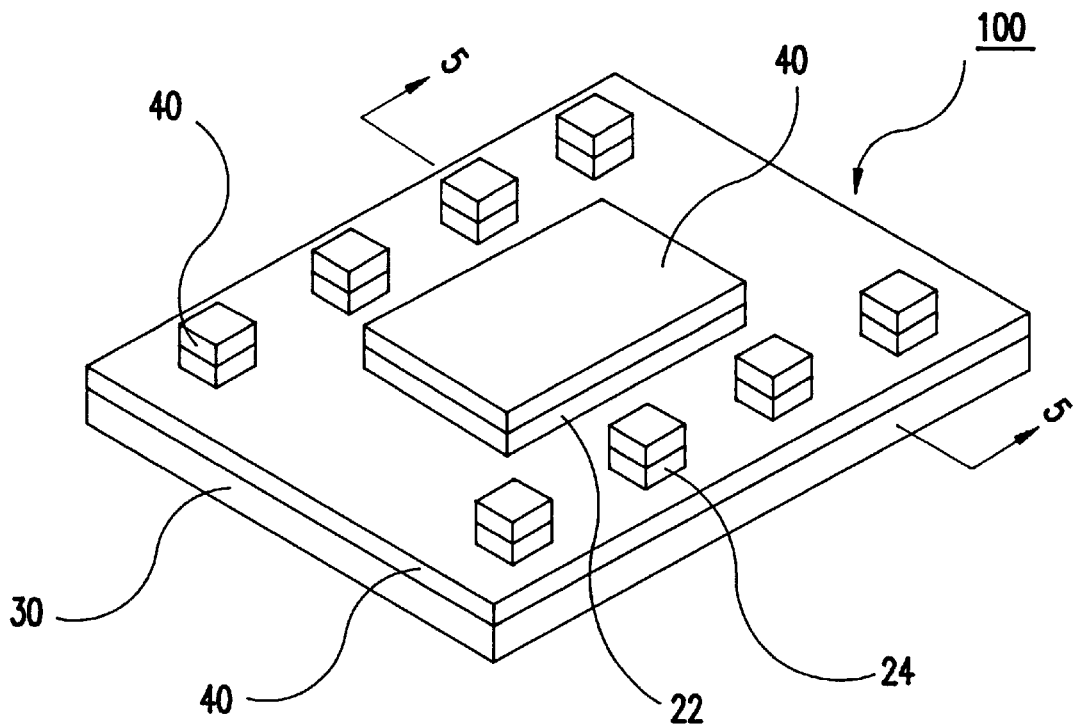
Figure 5:
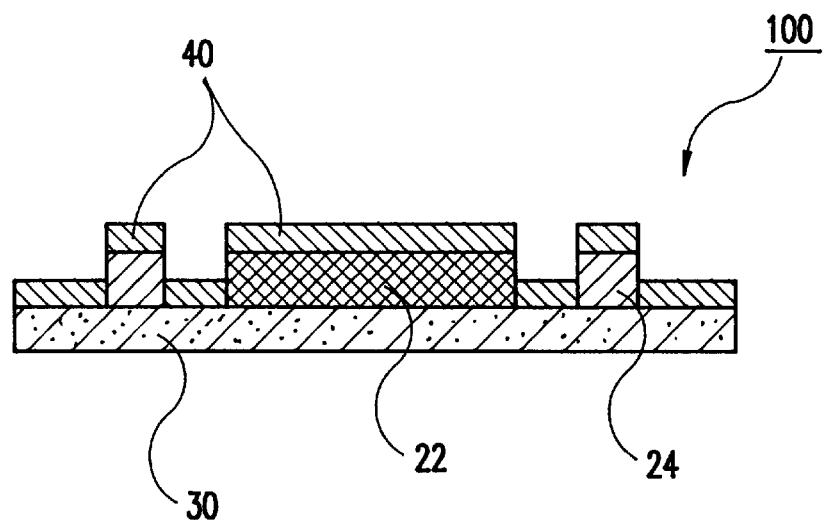

FIG. 4 is a perspective view of the column lead material in FIG. 3, which has a metal layer formed thereon; and FIG. 5 is a sectional view taken along the line 5—5 in FIG. 4. With reference to FIGS. 4 and 5, a metal layer 40 is formed on an upper surface of the column leads 24, on an upper surface of the die pad 22 and on exposed areas of the upper surface of the polyimide film 30, not covered by the die pad or the column leads, by a plating method to form a plated assembly 100. The metal layer 40 may advantageously be made from gold or palladium, since these materials facilitate release of the encapsulant after the subsequent molding process.

Figure 6:
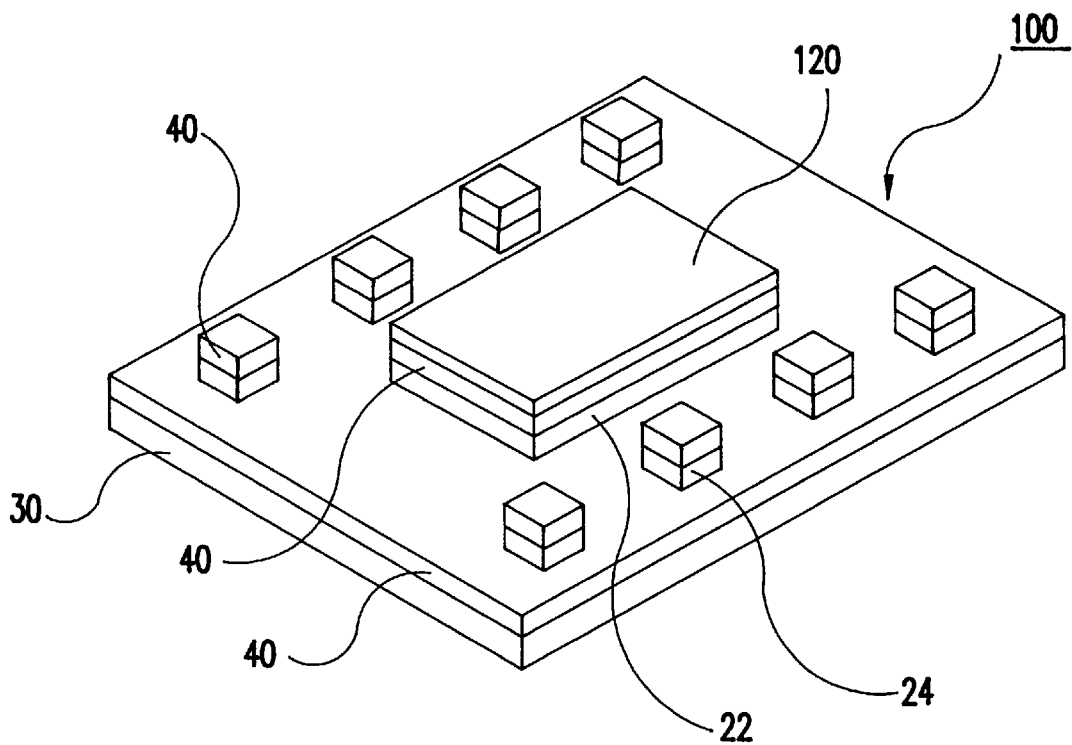
Figure 7:
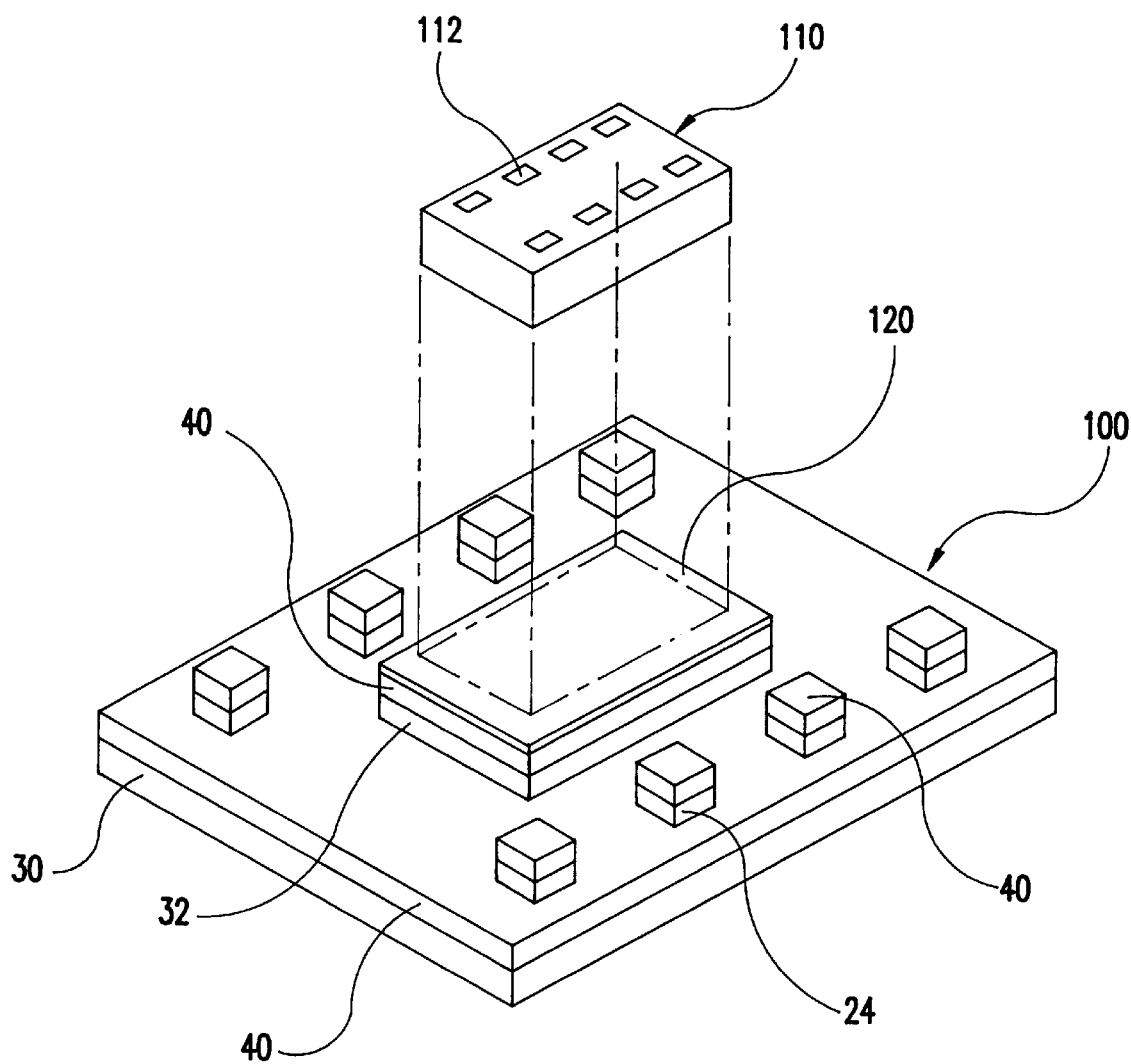
Figure 8:
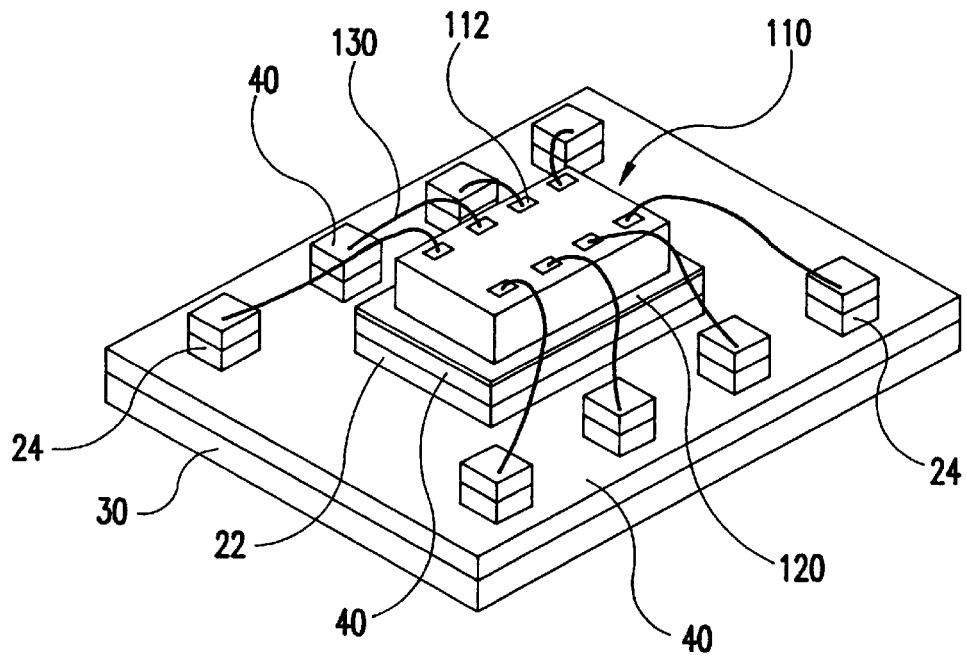
Figure 9:
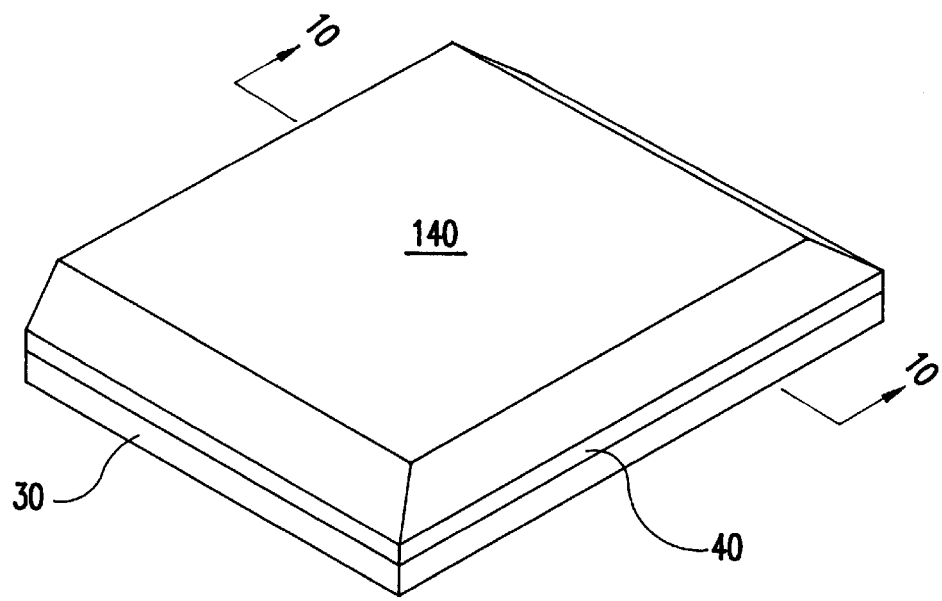
Figure 10:
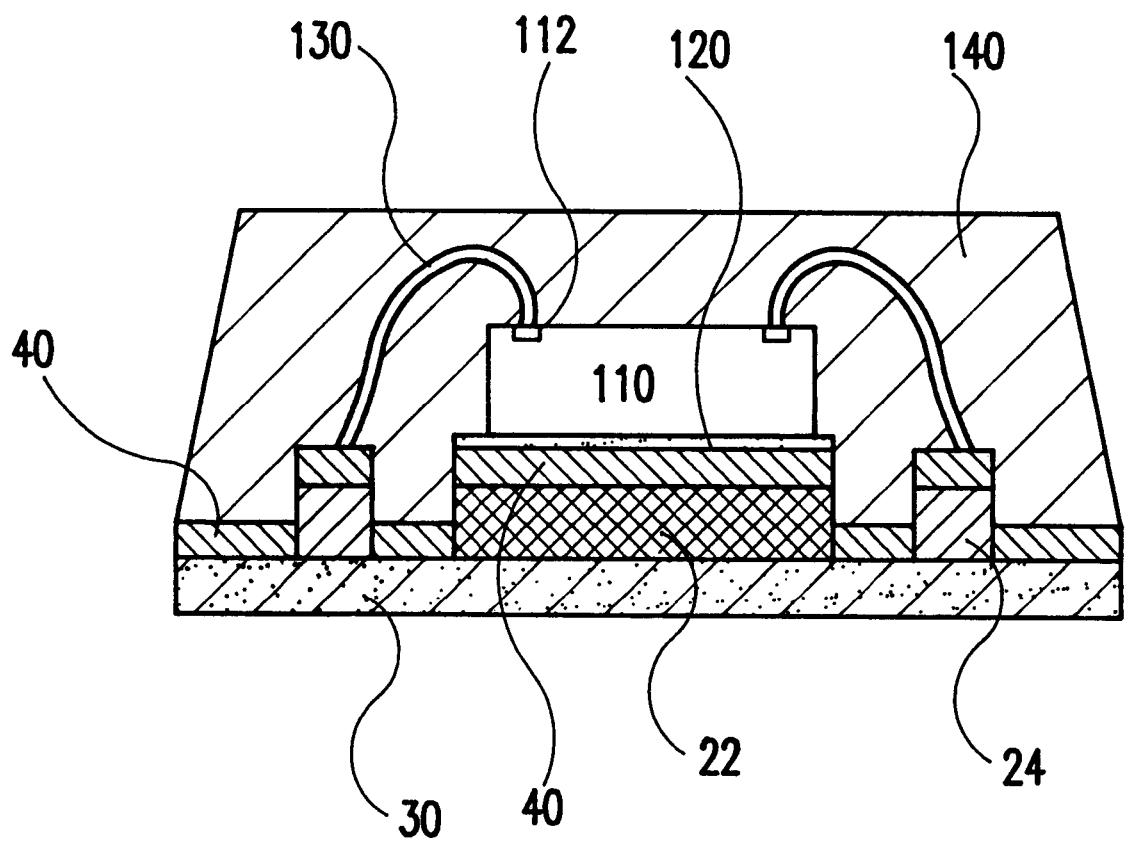
Figure 11:
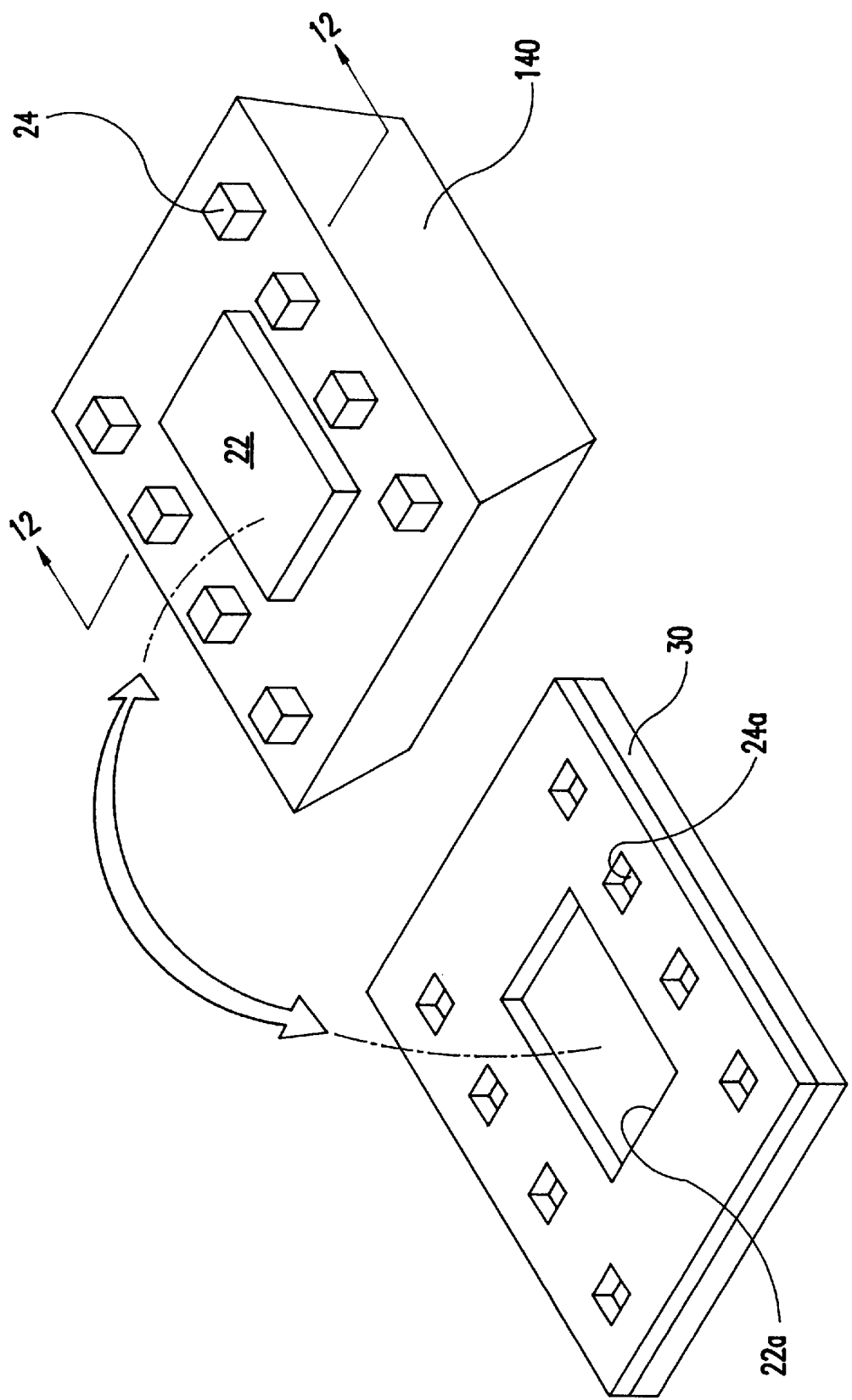
Figure 12:
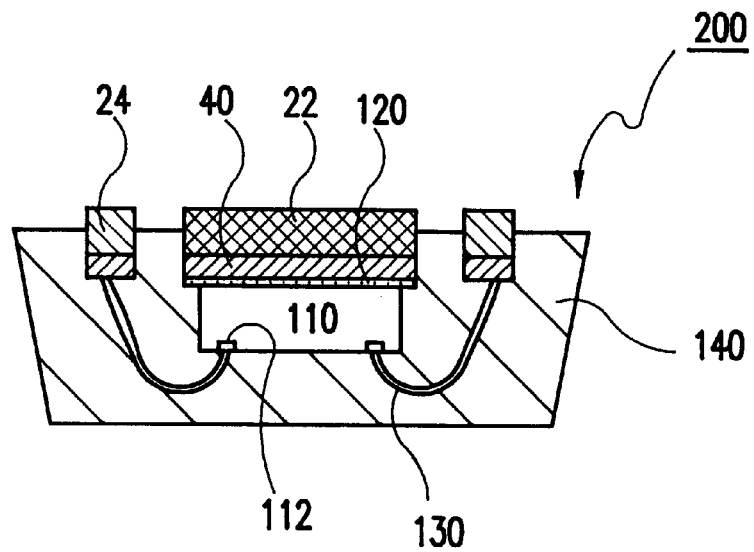

FIG. 6 is a perspective view showing the column lead material in FIG. 4, in which the die pad is coated with an adhesive; FIG. 7 is a perspective view depicting the attachment of a chip to the die pad; FIG. 8 is a perspective view depicting the electrical connections between the column leads and the chip; FIG. 9 shows the structure of the package assembly in FIG. 8 after the molding process is completed; FIG. 10 is a sectional view taken along the line 10—10 in FIG. 9; FIG. 11 shows removal of the polyimide film and metal layer from the package assembly in FIG. 10 to give a package; and FIG. 12 is a sectional view taken along the line 12—12 in FIG. 11.

With reference to FIGS. 6 through 12, the metal layer 40 on the die pad 22 is coated with an adhesive, for example Ag-epoxy adhesive 120, and a chip 110 is attached to the metal layer 40. Then, bonding pads 112 are electrically connected to a corresponding one of the column leads 24 by using an electrical connection means, for example bonding wires 130. The chip 110, die pad 22, column leads 24, wire bonding interconnections 130 and polyimide film 30 including the metal layer 40 thereon are encapsulated with an encapsulant such as a potting resin or an EMC (Epoxy Molding Compound) to give a package body 140.

Finally, the polyimide film 30 and the metal layer 40 on the polyimide film 30 are simultaneously removed to give a package 200. The removed polyimide film 30 and metal layer 40 has a depression 22a and a plurality of depressions 24a corresponding to the die pad 22 and column leads 24, respectively. The package 200 has the column leads 24 and die pad 22 extending outward from the package body 140. The reason why the column leads and die pad extend outward from the package body will be described hereinafter.

The processes described above require the following:

(1) The thickness of the polyimide film is preferably smaller than that of the column lead material. If the polyimide film has a greater thickness, a larger amount of polyimide is required and a longer period of time is required for curing it.

(2) The metal layer has preferably a greater bonding strength to the polyimide film than to the epoxy potting resin or the EMC, facilitating an easy removal thereof from the package assembly when the individual package assembly having column leads according to the present invention as shown in FIGS. 9 and 10 is separated. For this purpose, the metal layer is made from Au or Pd.

(3) The column leads have preferably the same thickness as the die pad. The column leads and die pad having a desired height are simultaneously formed on the column lead material by a single etching process. If the thickness of the column leads is different from that of the die pad, two or more etching steps would be required to form separately the column leads and die pad of different heights, resulting in an increase in the production time.

(4) The thickness of metal layer is preferably half the thickness of the column lead or die pad.

For the above-described items (1), (2) and (4), when an individual package having column leads according to the present invention is separated, the polyimide film and metal layer thereon are simultaneously removed. According to one aspect of the present invention, since the thickness of the metal layer is a half of those of the column lead and die pad, and the thickness of the polyimide film is the same as or greater than that of the metal layer, the individual package can be separated without delamination between the polyimide film and the metal layer. If the thickness of the polyimide film is too small, it cannot provide a sufficiently strong support when the column leads and die pad are formed by an etching process.

And, if the thickness of the metal layer is less than half of those of the die pad and column leads, the column leads and die pad, which will be exposed outward from the package body after the polyimide film and metal layer are removed, will have a disadvantageously small height. That it to say, when the package having column leads according to the present invention is mounted on and electrically connected to an external electronic device such as a printed circuit board by soldering, the solder may spread due to a capillary phenomenon between neighboring individual column leads or between column leads and the die pad, resulting in an electrical failure of the device.

On the other hand, if the thickness of the metal layer is greater than half of those of the die pad and column leads, the column leads and die pad, which will be exposed outward from the package body after the polyimide film and metal layer are removed, will have a disadvantageously great height. That it to say, if the package having column leads according to the present invention were to be mounted on a printed circuit board, it would be difficult to precisely mount the package onto the printed circuit board.

Figure 13:
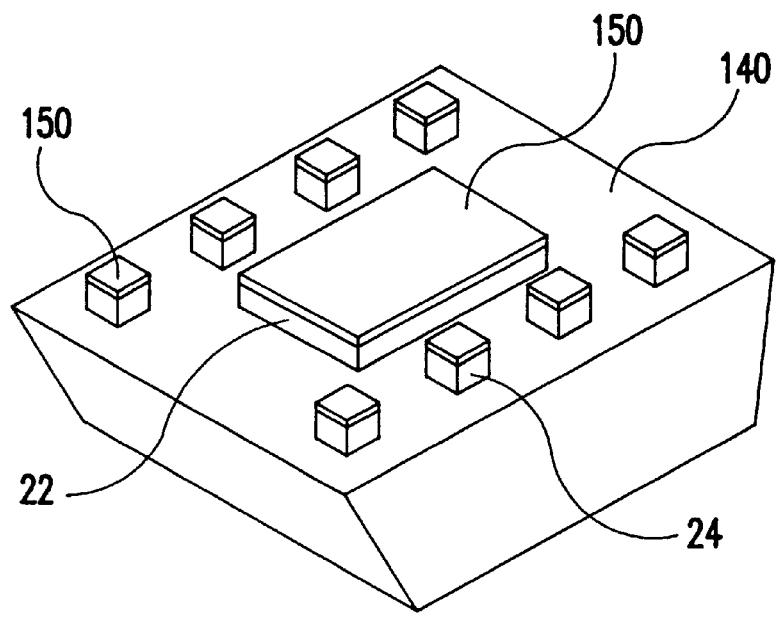
FIG. 13 is a perspective view depicting the package assembly structure of FIG. 12, in which column leads and the die pad are solder-plated.
Figure 14:
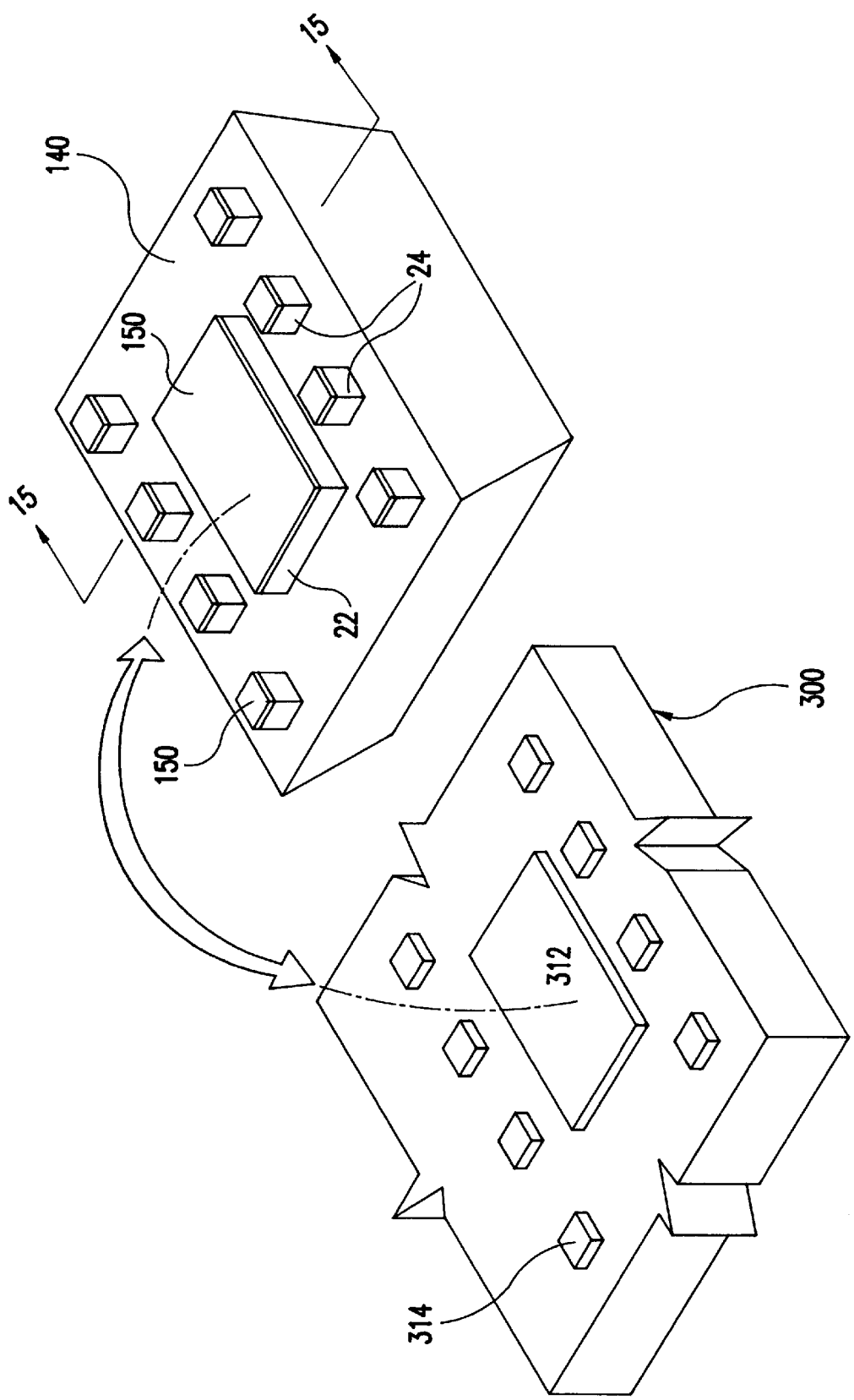
FIG. 14 shows a mounting of the package of FIG. 13 onto a printed circuit board.

FIG. 13 is a perspective view depicting the package assembly structure of FIG. 12 in which the column leads and die pads are solder-plated; FIG. 14 shows mounting of the package in FIG. 13 onto a printed circuit board; and FIG. 15 is a sectional view taken along the line 15—15 in FIG. 14.

Figure 15:
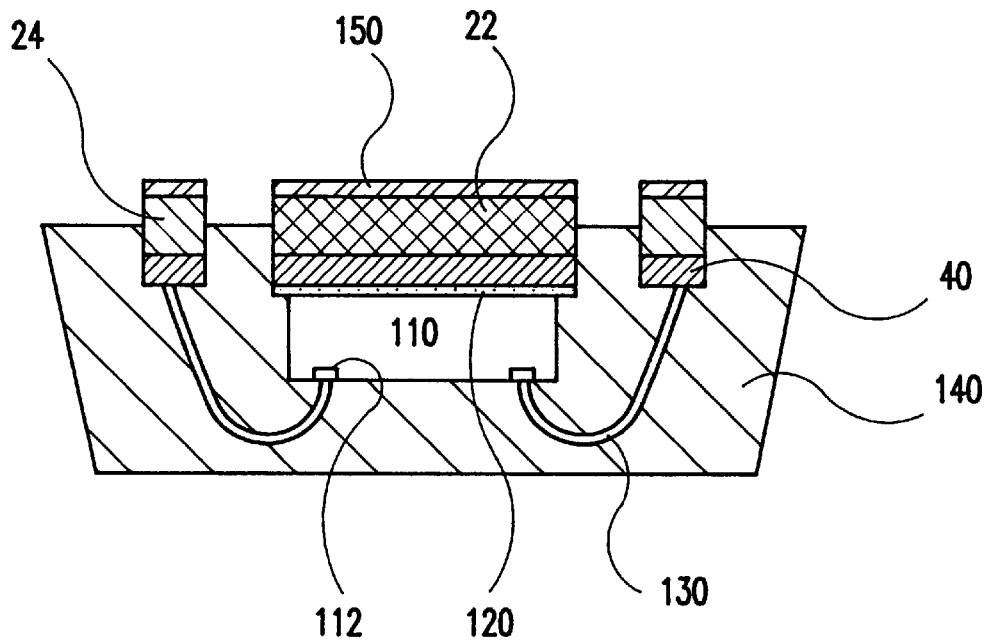
FIG. 15 is a sectional view taken along the line 15—15 in FIG. 14.

With reference to FIGS. 13 through 15, the package 200 has a solder layer 150 plated on the bottom surfaces of die pad 22 and of column leads 24, the bottom surfaces extending outward from the package body 140. The printed circuit board 300 has a heat dissipation part 312 in a central region thereof and a plurality of land patterns 314 formed in two parallel rows on opposite sides of the heat dissipation part 322. The die pad 22 and the column leads 24 are mounted on and electrically connected to the corresponding heat dissipation part 312 and the corresponding land patterns 314, respectively. The electrical connection as well as mechanical connection between the package 200 and the printed circuit board 300 can be accomplished by a solder layer 150 on the die pad and column leads.

The die pad 22 will be described in detail below. When power is supplied to the package 200, the chip 110 within the package 200 operates, generating heat. For a highly integrated chip or high performance chip, a large amount of heat is generated, causing deterioration of package reliability. For the present invention, the die pad 22 extending from and exposed outward from the package body 140 serves as a heat sink for efficient heat dissipation.

The invention according to the first embodiment has the following advantages:

(1) The package can be manufactured by a simple process, since the die pad and the column leads are formed by a conventional etching process. This facilitates an improvement in the package reliability.

(2) The die pad extending outward from the package body facilitates an efficient dissipation of heat generated during the operation of the package. This is particularly advantageous for the highly integrated chips or high performance memory chips, which usually generate a great amount of heat.

(3) The package has short electrical connections so that it can comply with high speed requirements and it can have a small size.

Figure 16:
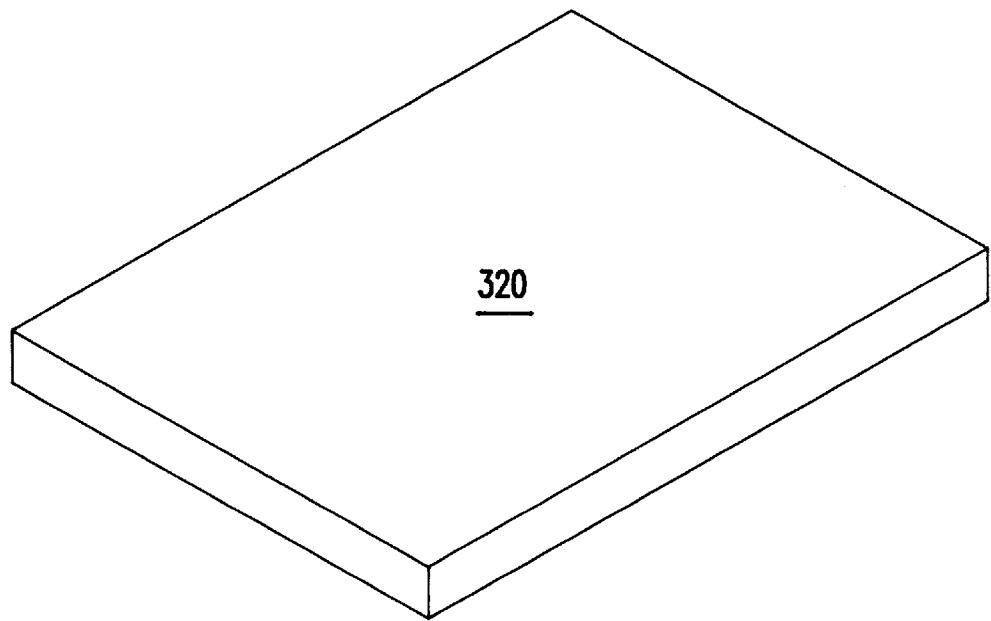
Figure 17:
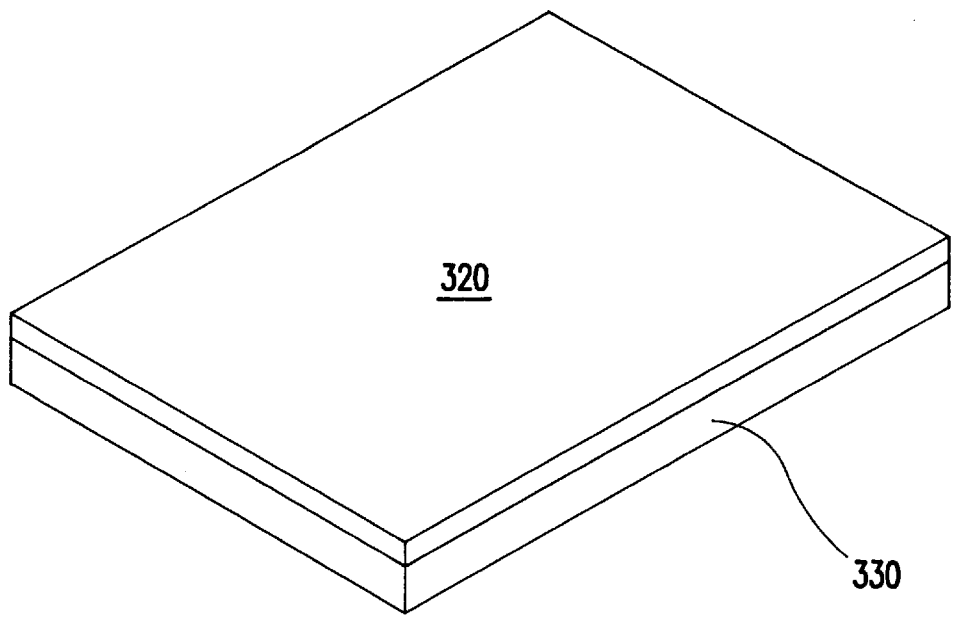
Figure 18:
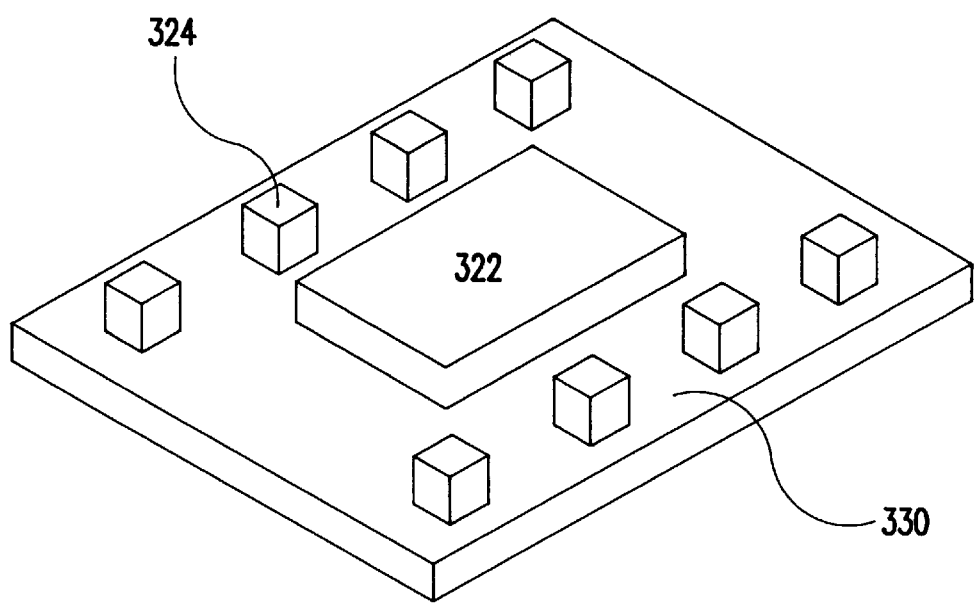

A second embodiment of the present invention will be described with reference to FIGS. 16–28. FIG. 16 is a perspective view of a column lead material; FIG. 17 is a perspective view of the column lead material in FIG. 16, which is coated with polyimide film; FIG. 18 is a perspective view depicting the column lead material, which is etched so that column leads and a die pad are formed on one surface thereof; and FIG. 19 is a perspective view depicting the die pad etched so as to have a height half of its original height.

With reference to FIGS. 16 through 19, a column lead material 320 is prepared to manufacture a package having column leads. The column lead material 320 can be made from electrically conductive metals such as a copper or a copper alloy. Liquid polyimide is applied onto the bottom surface of the column lead material 320 and a curing is carried out to form an even polyimide film 330. The thickness of the polyimide film 330 is smaller than that of the column lead material 320. The reason therefore will be described hereinafter.

The column lead material 320 is then etched to form column leads 324 and a die pad 322. The column leads 324 will be electrically connected to a respective one of a group of bonding pads of a chip and the die pad 322 will be attached to the chip. The die pad 322 is formed at the center region of the column lead material 320, while a plurality of column leads 324 are formed in two parallel rows on opposite sides of the die pad 322. As shown in FIG. 19, the die pad 322 is etched so as to reduce it to half its normal height. The reduced height die pad is shown at reference numeral 323.

Figure 19:
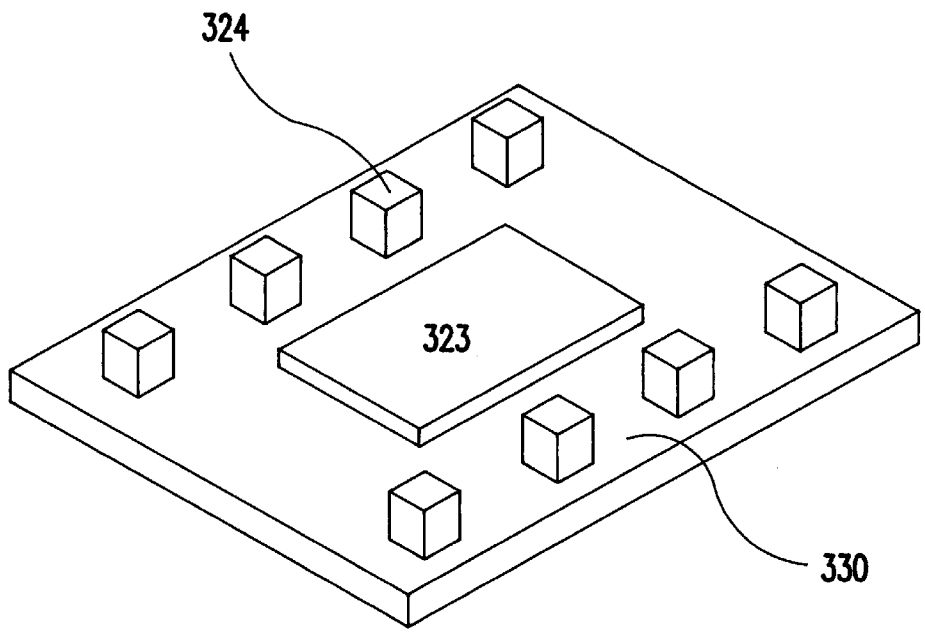
Figure 20:
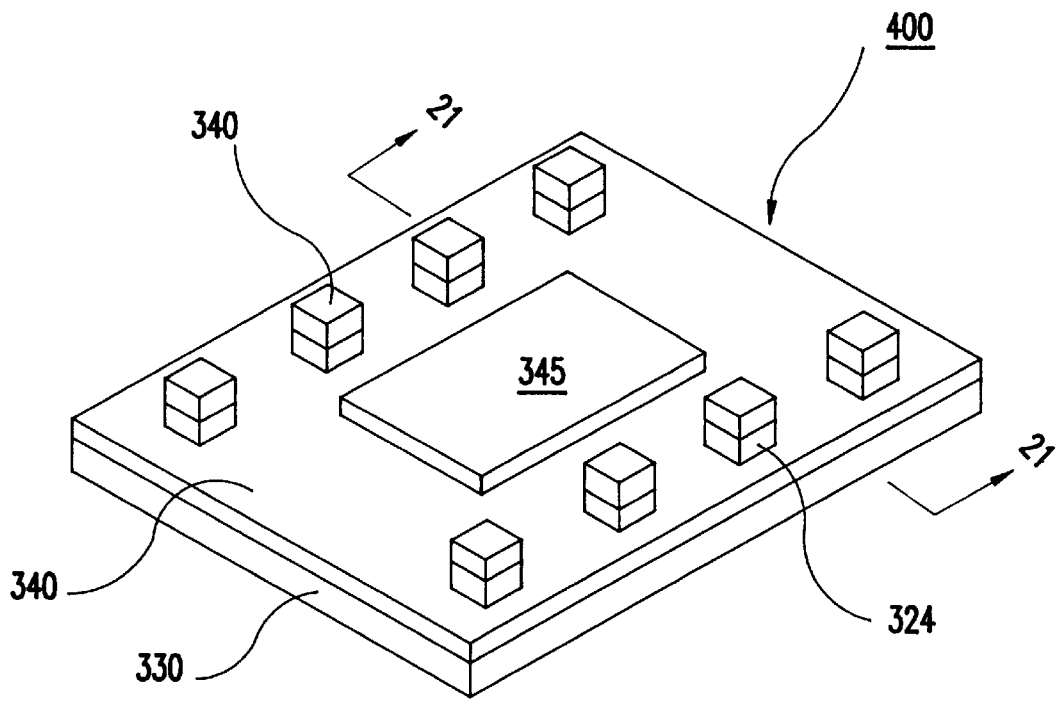
Figure 21:
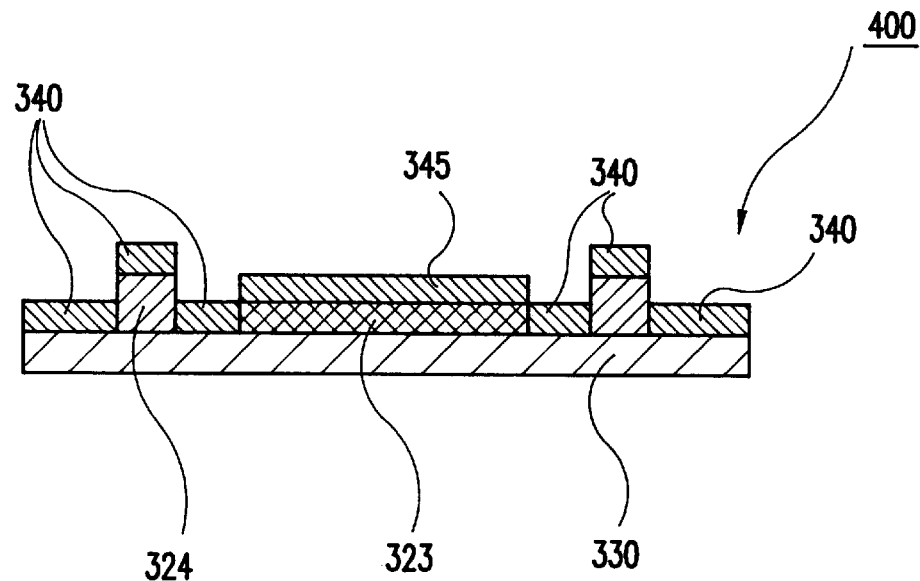

FIG. 20 is a perspective view of the column lead material in FIG. 19, which has a metal layer formed thereon; and FIG. 21 is a sectional view taken along the line 21—21 in FIG. 20. With reference to FIGS. 20 and 21, a first metal layer 340 is formed on an upper surface of the column leads 324 and on an exposed part of the upper surface of the polyimide film 330 by a plating method to form a plated assembly 400. A second metal layer 345 is formed on an upper surface of die pad 323 by a plating method so that the die pad 323 is embedded within the second metal layer 345.

The first metal layer 340 may advantageously be made from gold or palladium, since these materials ease release of the encapsulant after the subsequent molding process. The second metal layer 345 preferably has a greater bonding strength to an encapsulant than to the column lead material 320; and the reason therefor will be explained hereinafter.

Figure 22:
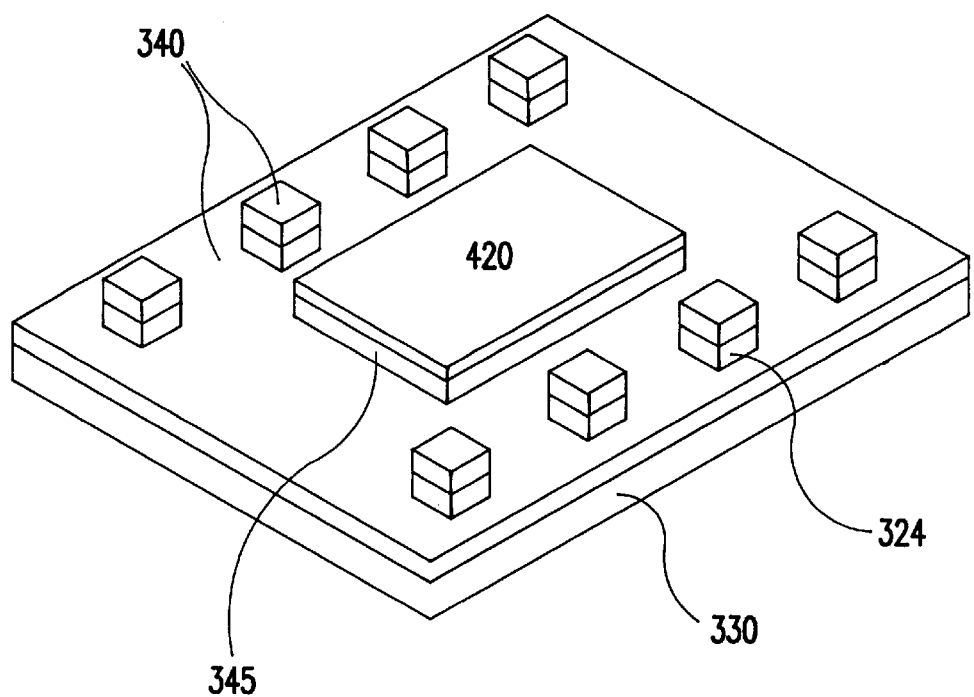
Figure 23:
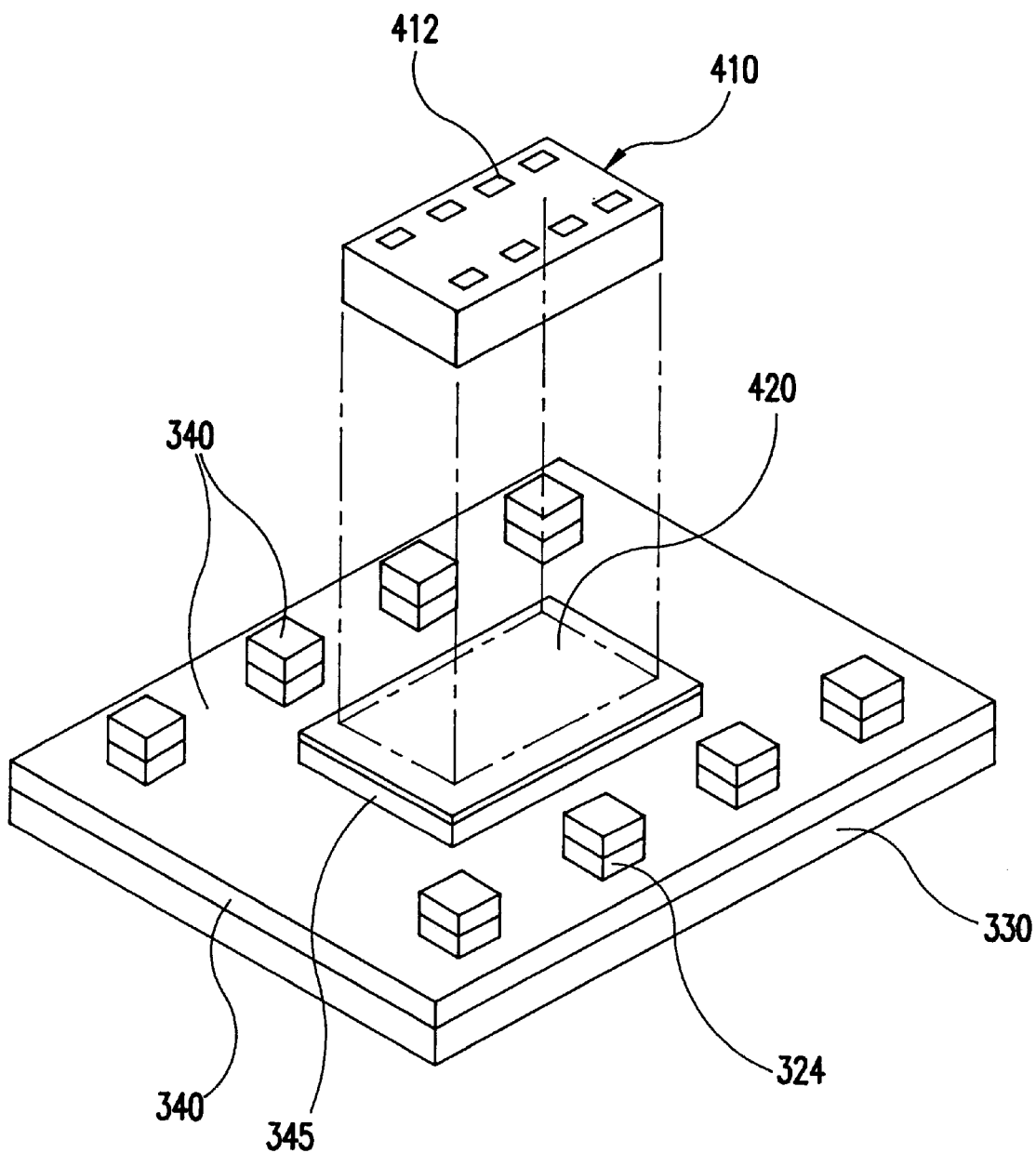
Figure 24:
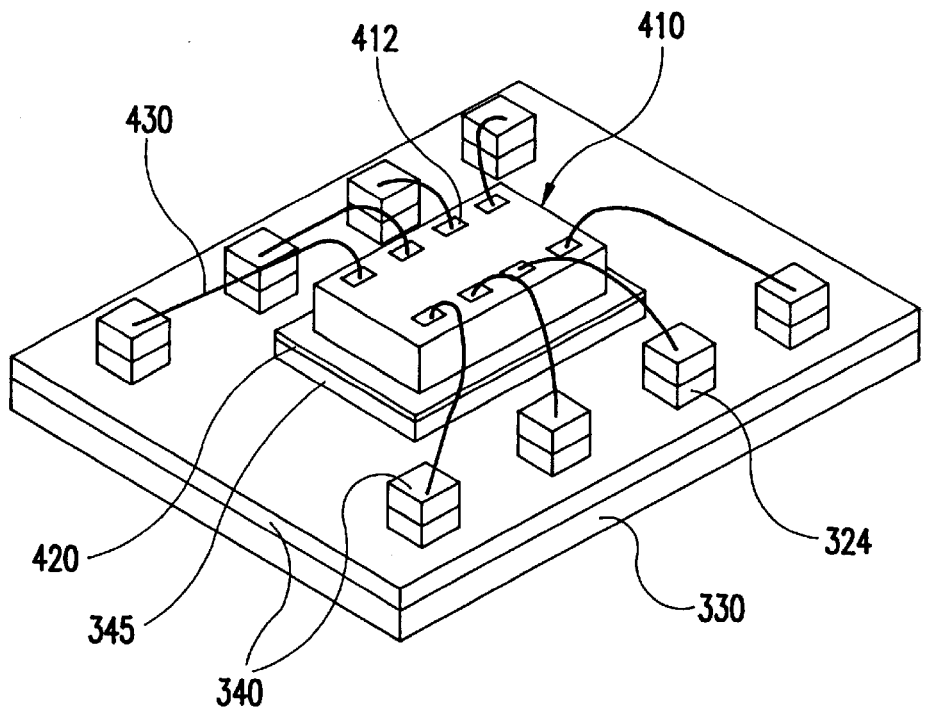
Figure 25:
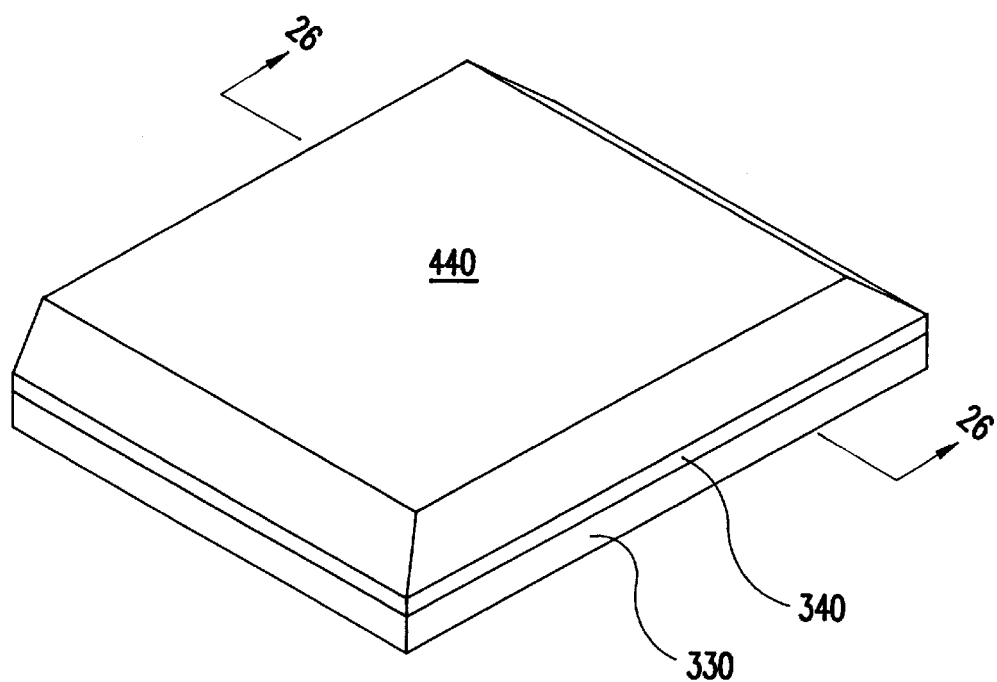
Figure 26:
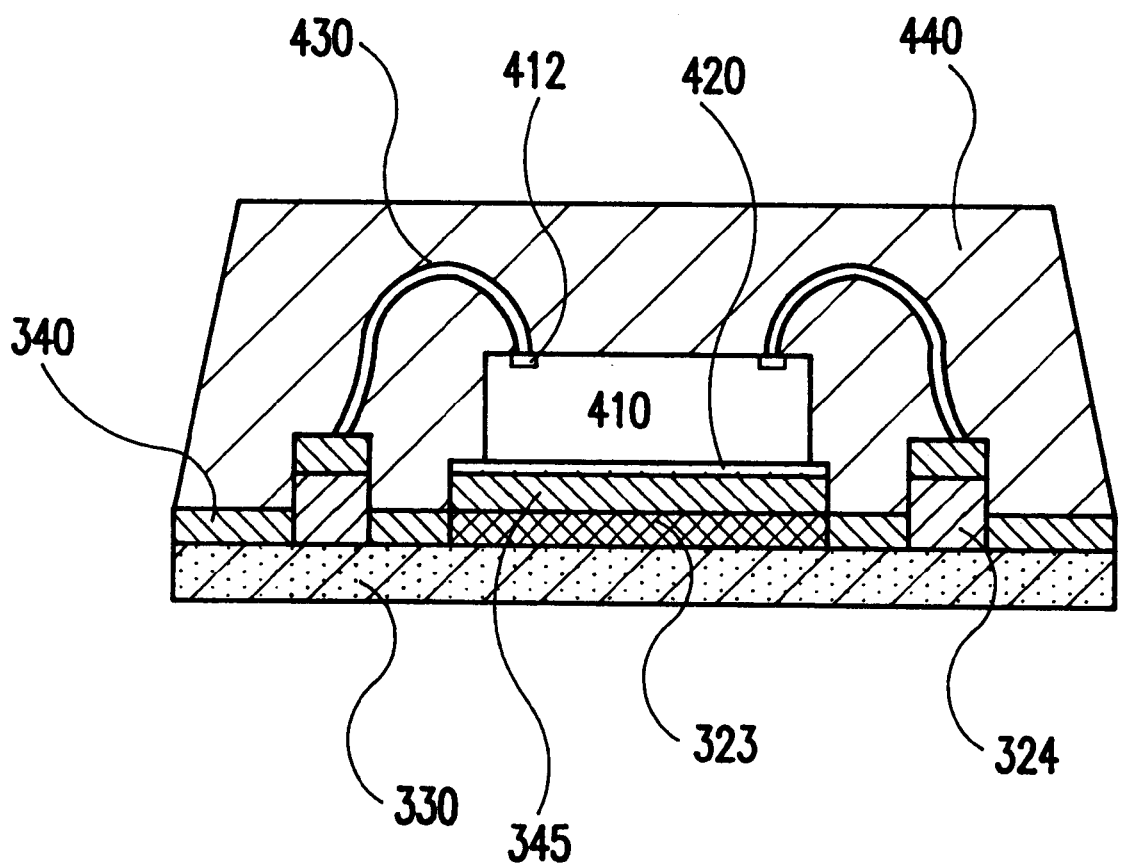
Figure 27:
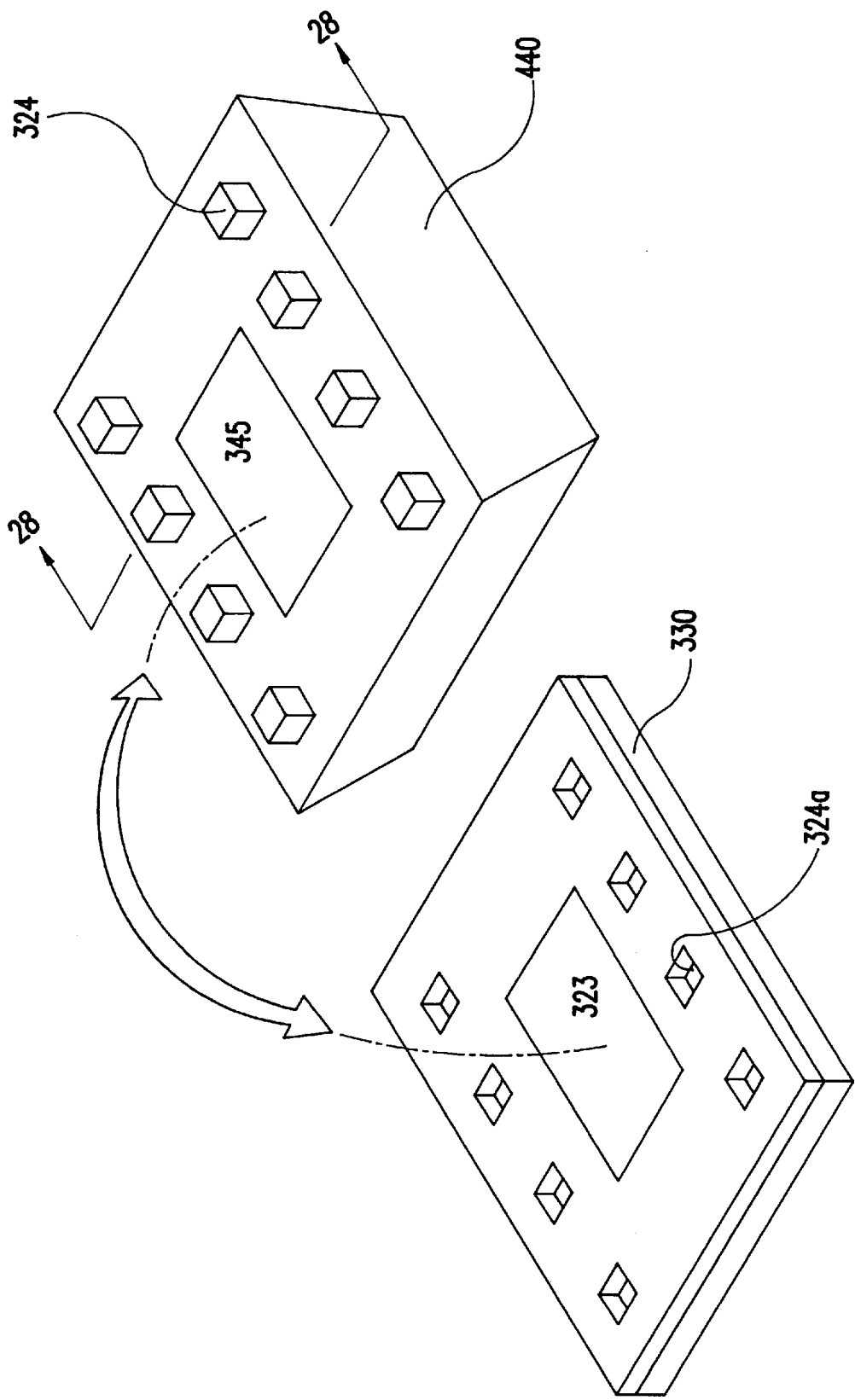
Figure 28:
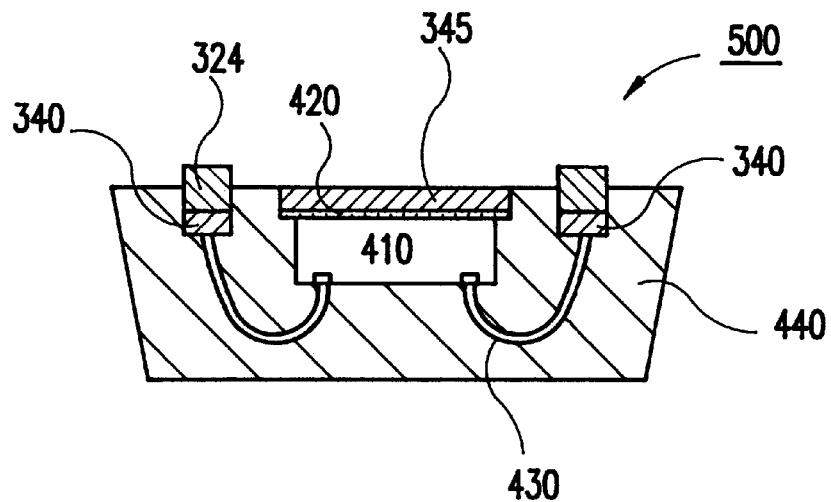

FIG. 22 is a perspective view showing the column lead material in FIG. 20, in which the die pad is coated with an adhesive; FIG. 23 is a perspective view depicting the attachment of a chip to the die pad; FIG. 24 is a perspective view depicting the electrical connections between the column leads and the chip; FIG. 25 shows the structure of the package assembly in FIG. 24 after the molding process is completed; FIG. 26 is a sectional view taken along the line 26—26 in FIG. 25; FIG. 27 shows removal of the polyimide film and metal layer from the package assembly in FIG. 25 to give a package; and FIG. 28 is a sectional view taken along the line 28—28 in FIG. 27.

With reference to FIGS. 22 through 28, the second metal layer 345 on the die pad 323 is coated with an adhesive, for example Ag-epoxy adhesive 420, and a chip 410 is attached to the second metal layer 345 in such a way that the upper surface of the second metal layer 345 where the adhesive 420 is applied is bonded to the bottom surface of the chip 410. Then, bonding pads 412 are electrically connected to the respective column leads 324 by using an electrical connection means, for example, bonding wires 430. The chip 410, die pad 323, column leads 324, wire bonding interconnections 430 and polyimide film 330 including the first metal layer 340 thereon are encapsulated with an encapsulant such as a potting resin or an EMC to give a package body 440.

Finally, the polyimide film 330 and the first metal layer 340 on the polyimide film 330 are simultaneously removed to give a package 500. The die pad 323 on the upper surface of the polyimide film 330 is also removed when the polyimide film 330 is removed, since the bonding strength between the polyimide film 330 and the die pad 323 is greater than that between the die pad 323 and the second metal layer 345. The reason therefor will be described hereinafter.

The removed polyimide film 330 having the first metal layer 340 thereon has depressions 324a which correspond to column leads 324 of the package 500.

Therefore, for the second embodiment of the present invention, the package 500 has a structure that the bottom surface of the second metal layer 345 is flush with the surface of the package body 440. The only role of the die pad 323 is to fix and support the chip 410 throughout the assembly processes.

The processes described above require the following:

(1) The thickness of the polyimide film is preferably smaller than that of the column lead material. If the polyimide film has a thickness greater than the column lead material, a larger amount of polyimide is required and a longer period of time is required for curing it.

(2) The first metal layer 340 preferably has a greater bonding strength to the polyimide film 330 than to the epoxy potting resin, facilitating an easy removal thereof from the package assembly when the individual packages having column leads according to the present invention as shown in FIGS. 25 and 26 are separated. For this purpose, the metal layer is made of Au or Pd.

(3) The second metal layer 345 preferably has a greater bonding strength to the polyimide film 330 than to the die pad 323, facilitating a simultaneous removal thereof together with the die pad.

(4) The first metal layer 340 preferably has the same thickness as that of the second metal layer 345.

(5) The first metal layer 340 preferably has the same thickness as that of the die pad 323. Here, the first metal layer on the upper surface of the column leads are excluded from the explanation. Since the die pad is also removed when the polyimide film is removed, the former has preferably the same thickness as that of the first metal layer, considering the fact that the polyimide film is removed together with the first metal layer.

For the above-described items (1), (2), (3) and (5), when individual packages having column leads according to the present invention are separated, the polyimide film and the first metal layer are simultaneously removed. According to one aspect of the present invention, since the thickness of the metal layer is half that of the column lead and die pad, and the thickness of the polyimide film is the same as or greater than that of the metal layer, the individual packages can be separated without a delamination between the polyimide film and the metal layer. If the thickness of the polyimide film is too small, it cannot provide a sufficiently strong support when the column leads and die pad are formed by an etching process.

In addition, if the thickness of the first metal layer is less than half those of the die pad and column leads, the column leads and the die pad, which will be exposed outward from the package body after the polyimide film and first metal layer are removed, will have a disadvantageously small height. That it to say, when the package having column leads according to the present invention is mounted on and electrically connected to an external electronic device such as a printed circuit board by soldering, the solder may be spread due to a capillary phenomenon between neighboring individual column leads or between column leads and the die pad, resulting in an electrical failure of the device.

On the other hand, if the thickness of the first metal layer is greater than half those of the die pad and the column leads, the column leads and die pad, which will be exposed outward from the package body after the polyimide film and metal layer are removed, will have a disadvantageously large height. That it to say, when the package having column leads according to the present invention is mounted on a printed circuit board, it is difficult to precisely mount the package onto the printed circuit board.

Figure 29:
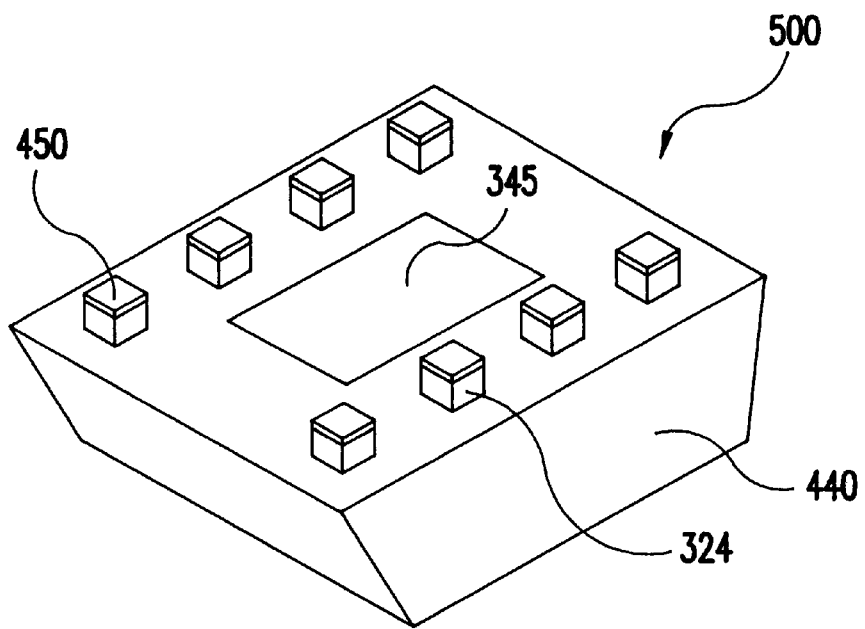
FIG. 29 is a perspective view depicting the package assembly structure in FIG. 27, in which the column leads and the die pad are solder-plated.
Figure 30:
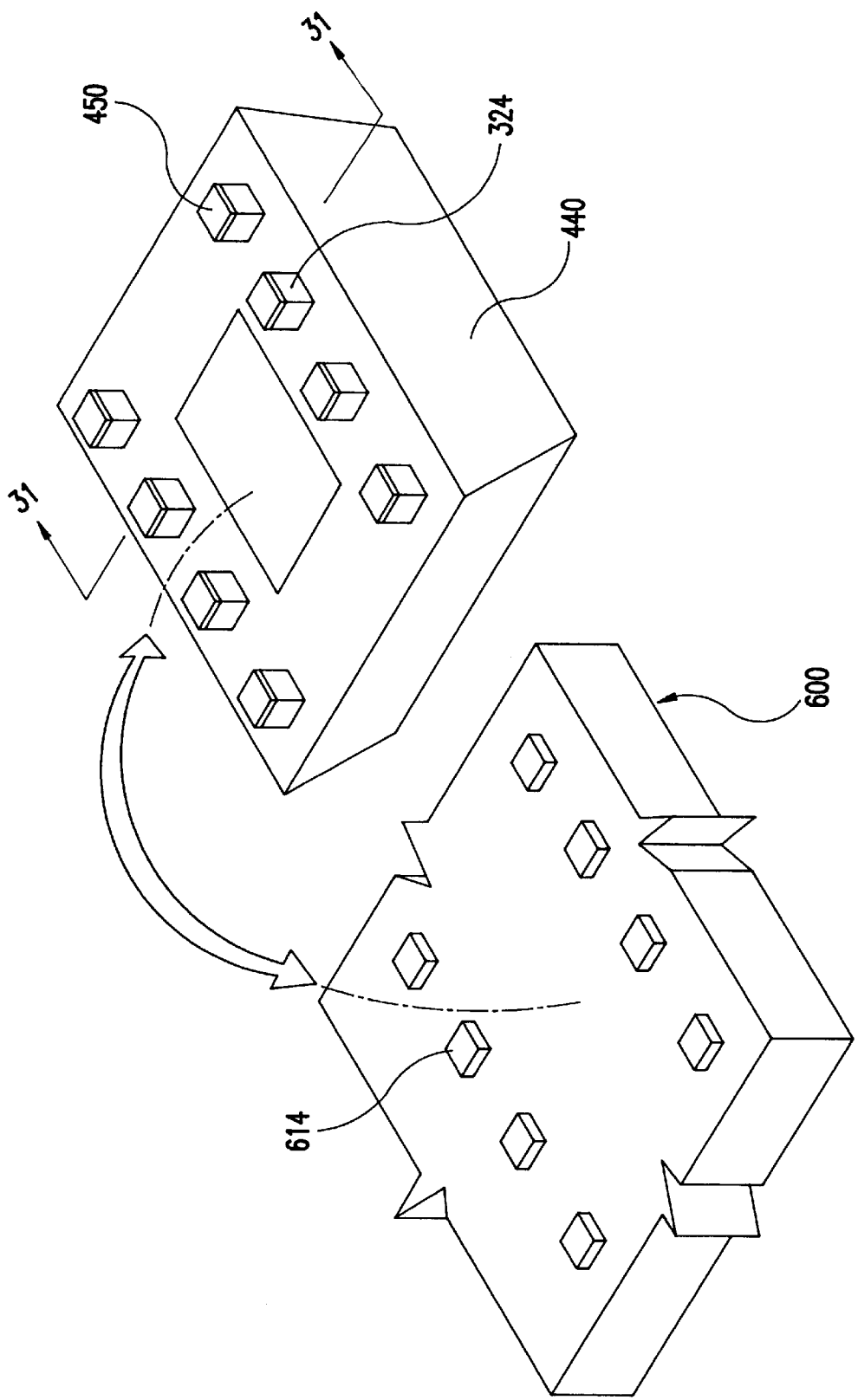
FIG. 30 shows a mounting of the package in FIG. 13 onto a printed circuit board.

FIG. 29 is a perspective view depicting the package structure in which the column leads are solder-plated; FIG. 30 shows mounting of the package in FIG. 29 onto a printed circuit board; and FIG. 31 is a sectional view taken along the line 31—31 in FIG. 30.

Figure 31:
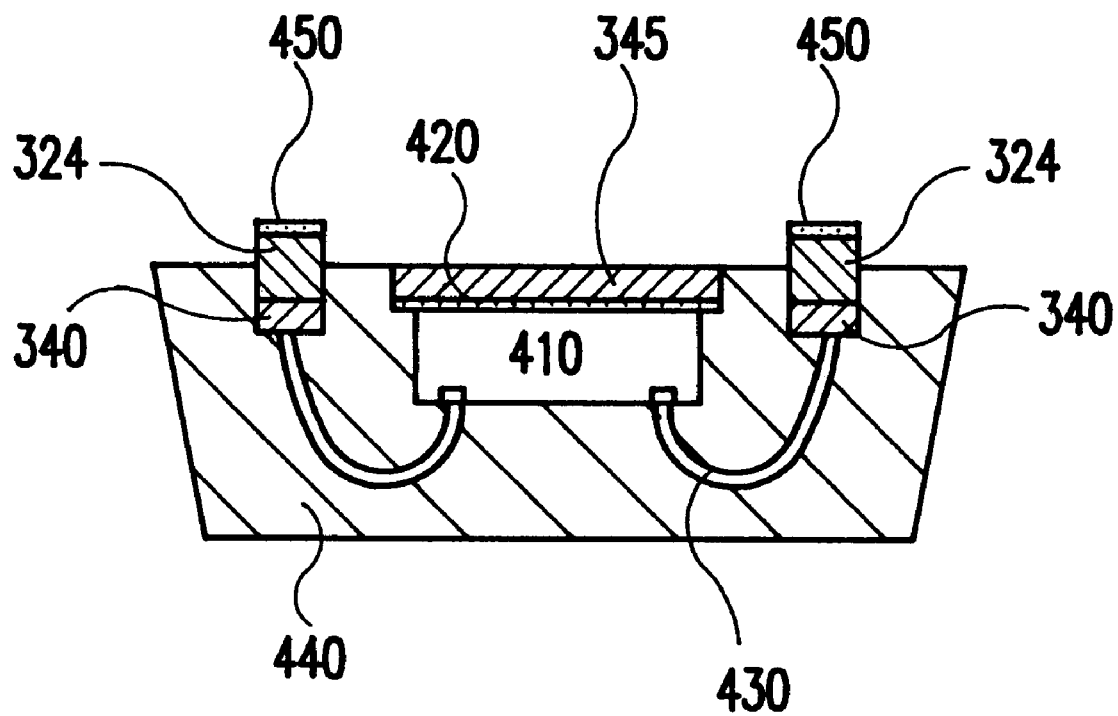
FIG. 31 is a sectional view taken along the line 31—31 in FIG. 30.

With reference to FIGS. 29 through 31, the package 500 has a solder layer 450 plated on the bottom surfaces of column leads 324, the bottom surfaces extending outward from the package body 440. The printed circuit board 600 has a plurality of land patterns 614 formed in two parallel rows on opposite sides of its surface. The column leads 324 are mounted on and electrically connected to the respective land patterns 614. The electrical connection as well as mechanical connection between the package 500 and the printed circuit board 600 can be accomplished by the solder layer 450 on the column leads.

The invention according to the second embodiment has the following advantages:

(1) The package can be manufactured by a simple process, since the die pad and column leads are formed by a conventional etching process. This facilitates an improvement in the package reliability.

(2) The package has short electrical connections so that it can comply with high speed requirements and it can have a small size.

Figure 32:
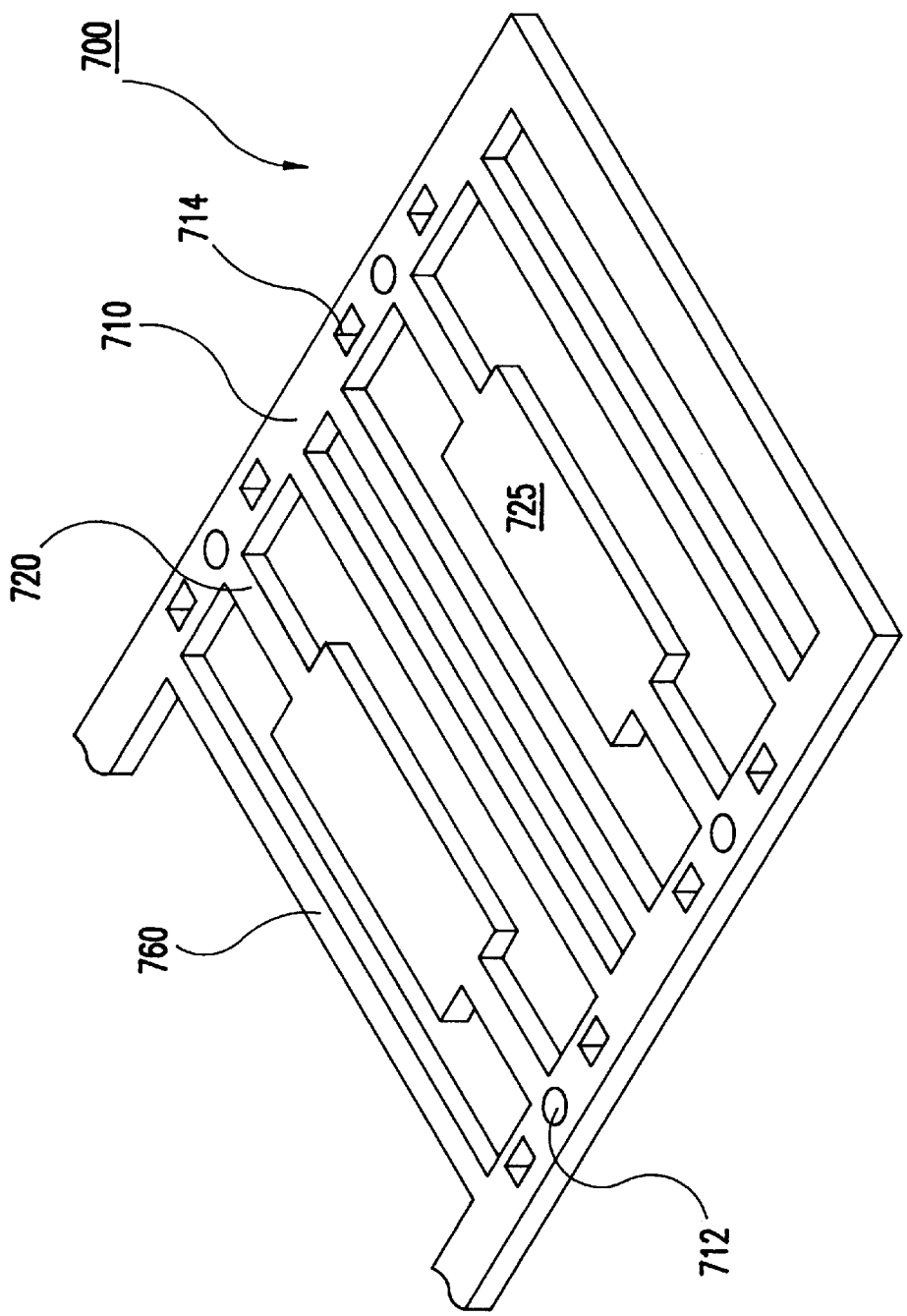
Figure 33:
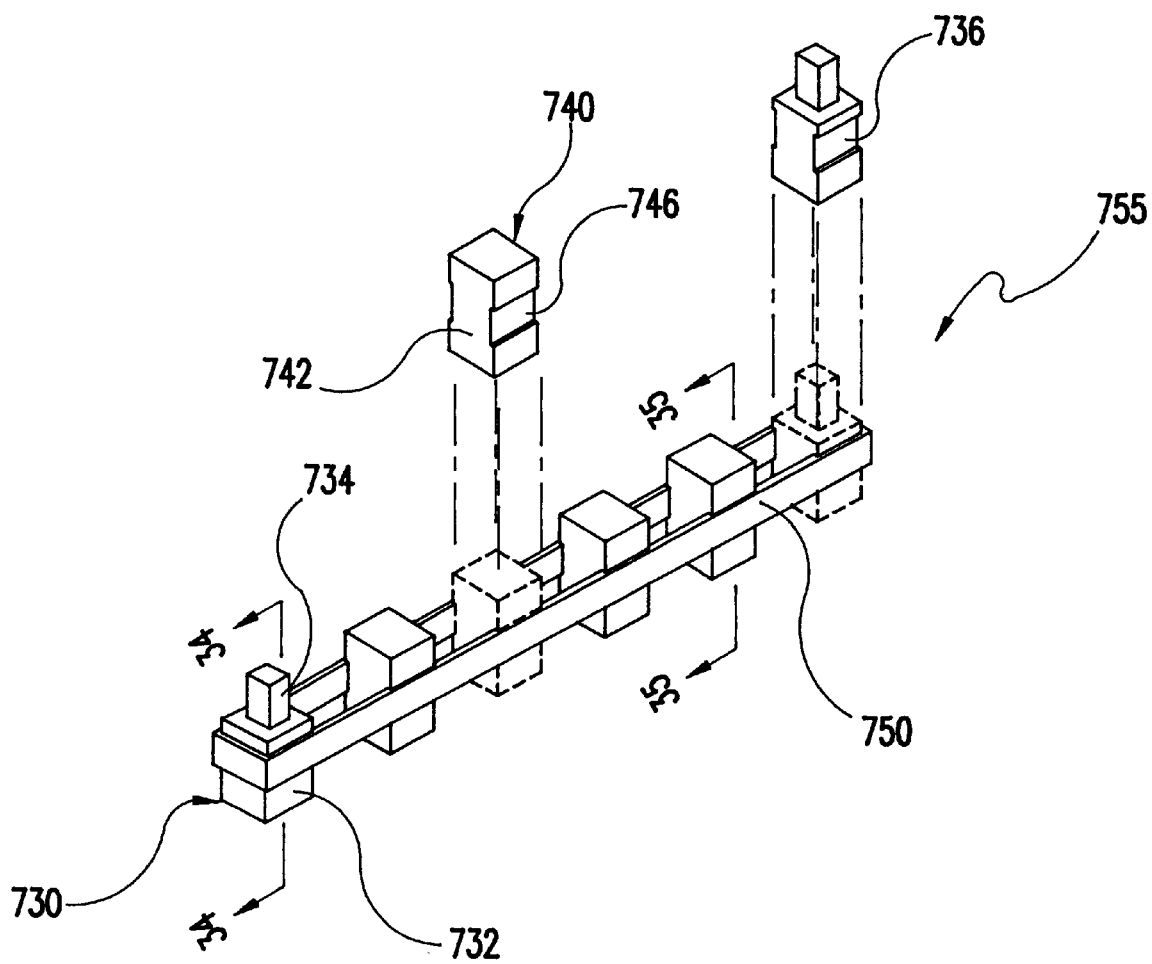
Figure 34:
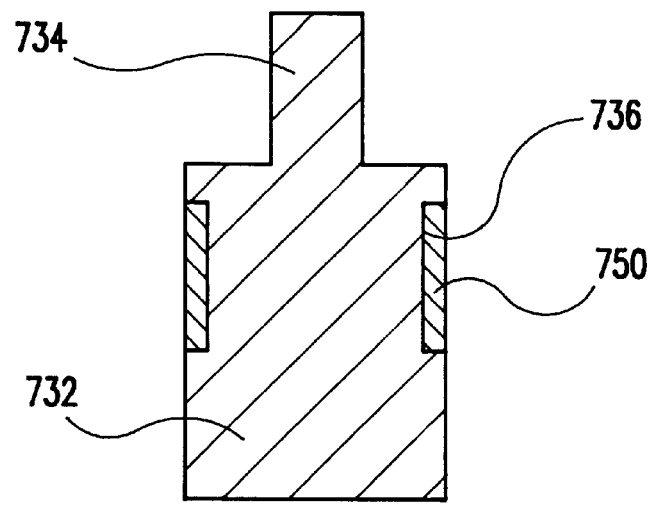
Figure 35:
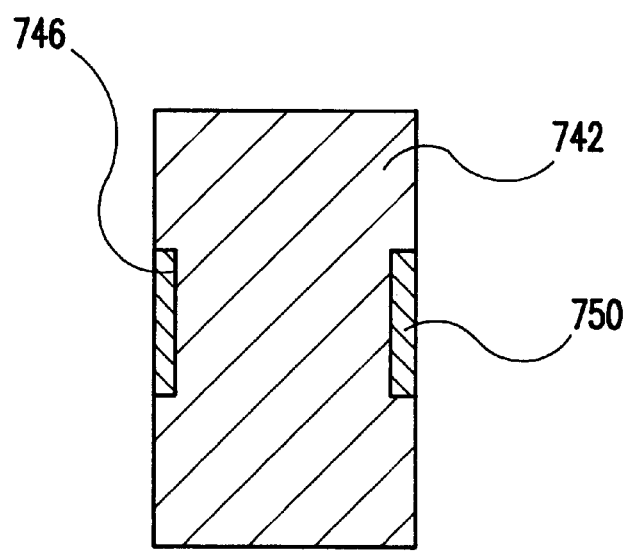
Figure 36:
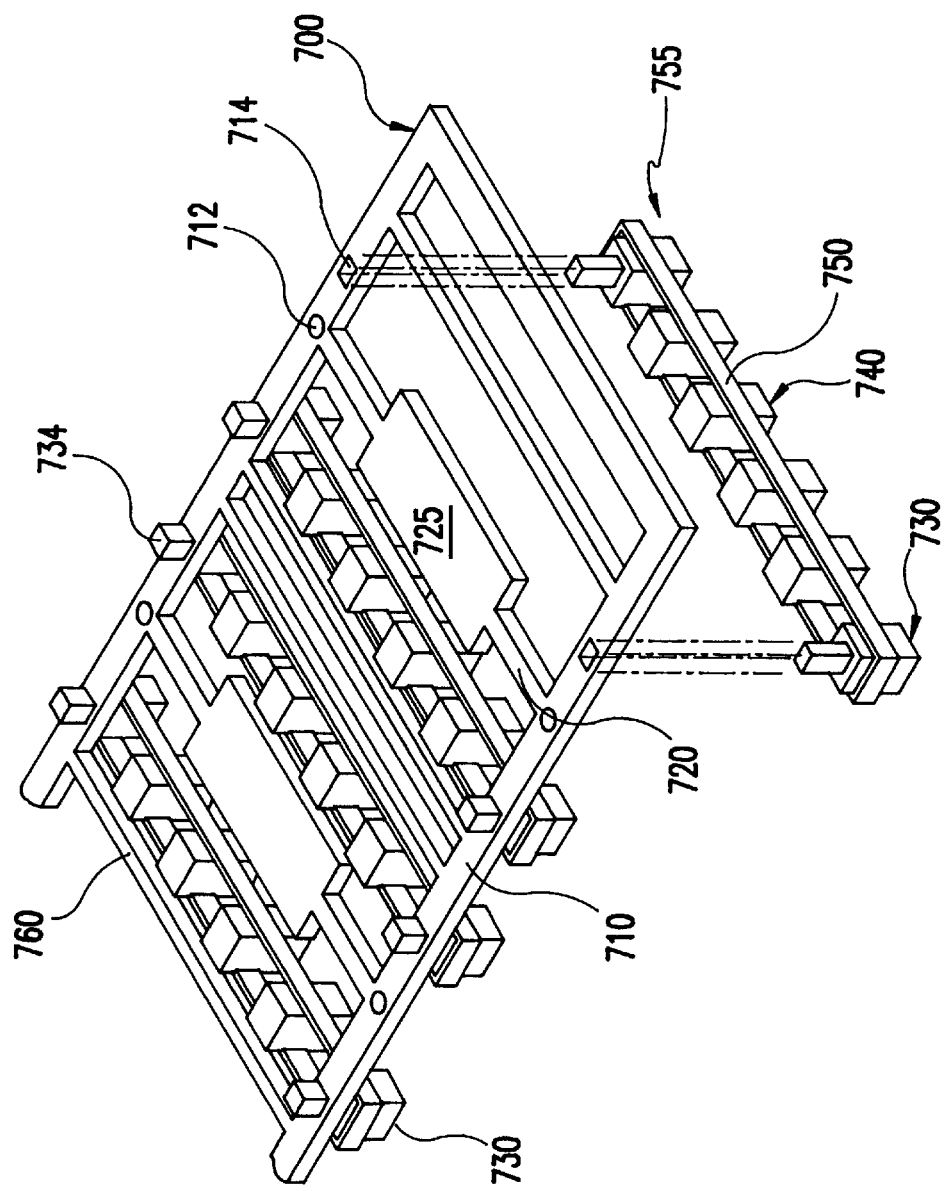
Figure 37:
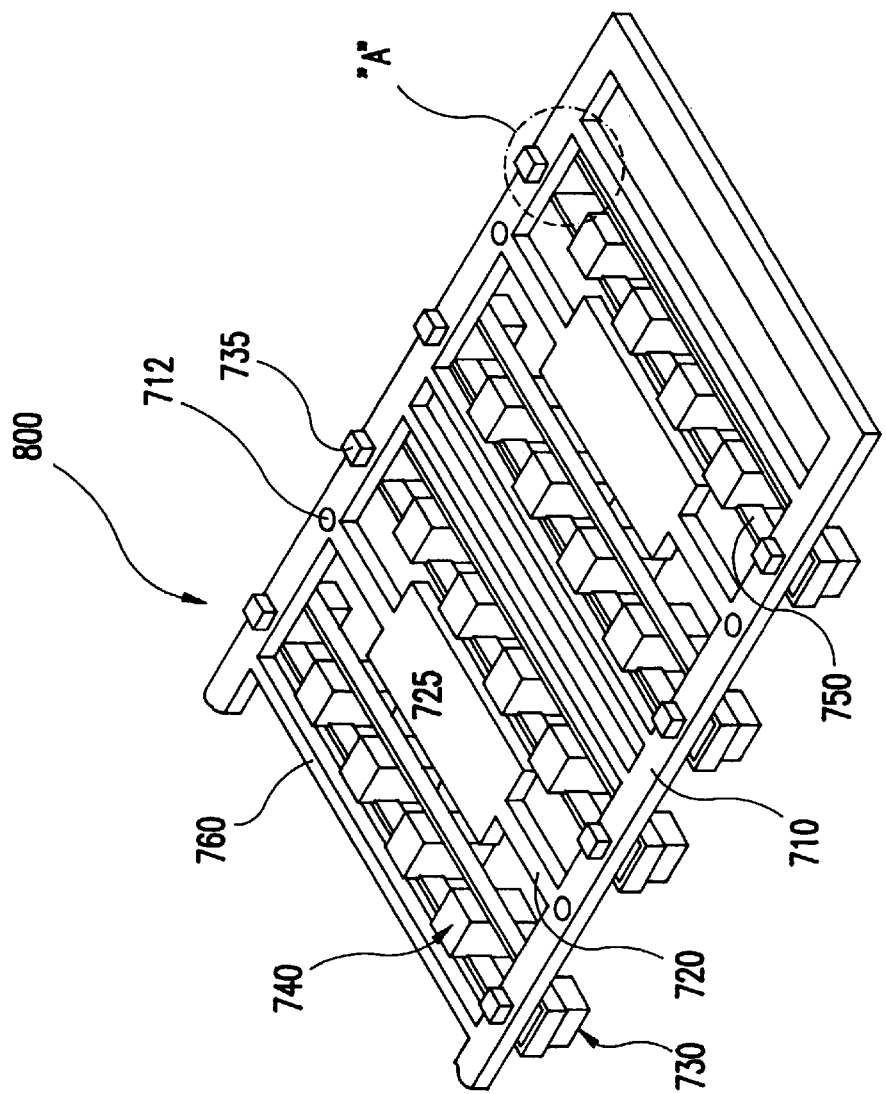
Figure 38:
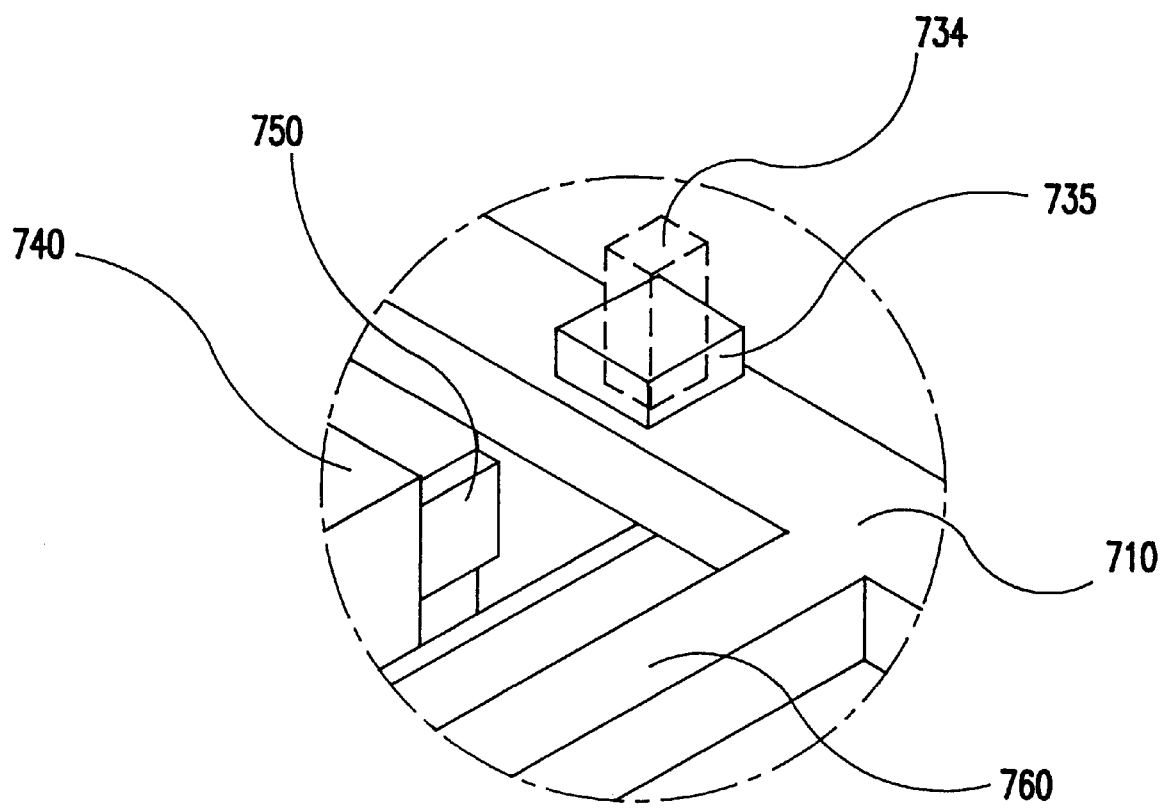

A third embodiment of the present invention will be described with reference to FIGS. 32–38. FIG. 32 is a perspective view depicting a lead frame strip employed for manufacturing a package having column leads; FIG. 33 shows a group of column leads; FIG. 34 is a sectional view of a linking column lead, which is taken along the line 34—34 in FIG. 33; FIG. 35 is a sectional view of a contacting column lead, which is taken along the line 35—35 in FIG. 33; FIG. 36 is a perspective view showing a linking of the column lead group to the lead frame; FIG. 37 is a perspective view showing a riveting of linking column leads to a lead frame; and FIG. 38 is an enlarged view of the part 'A' in FIG. 37.

With reference to FIGS. 32 through 38, the lead frame 800 according to the present invention comprises a die pad 725; two parallel side rails 710 on opposite sides of said die pad 725; tie bars 720 linking said die pad 725 to said side rails 710; a pair of column lead groups 755 which are linked mechanically to said side rails 710; and a pair of dam bars 760 disposed on an outward side of each column lead group and integral with said side rails 710.

The column lead group 755 may be made from electrically conductive metals such as a copper or copper alloy.

The side rails 710 have a plurality of index holes 712 and a plurality of through holes 714. The index holes 712 will receive a respective one of projecting parts of a transfer means (not shown) for transferring the lead frame 800, while each of the through holes 714 will receive a linking column lead 730, as described hereinafter. The index holes 712 and through holes 714 in one side rail correspond to the index holes 712 and through holes 714 in the other side rail.

The column lead group 755 comprises two linking column leads 730, a plurality of contacting column leads 740 disposed between the two linking column leads 730, and a band 750 for connecting the linking column leads 730 and contacting column leads 740 together. The contacting column leads 740 and linking column leads 730 are disposed at a specified distance from one another.

The structure of the column leads will be described in more detail with reference to FIGS. 33 through 35.

Each of the two linking column leads 730 is located at an outermost position of the column lead groups. The linking column leads 730 have a body 732, a projection 734, and grooves 736 formed in opposite walls of the body 732. The grooves 736 are in contact with the band 750. The projection 734 has a width, which is about one third of the width of the body 732, and is on the top of the linking column lead 730. The contacting column leads 740 have a body 742, which has grooves 746 formed on opposite walls thereof where it is in contact with the band 750. The band 750 may be made from, for example, polyimide.

The column lead groups 755 are mechanically connected to the side rail 710 of the lead frame 800 in such a way that one of two linking column leads 730 is inserted into one of through holes 714 in one side rail 710, and the other linking column lead 730 is inserted into one of through holes 714 in the opposite side rail 710; and further, the projections 734 of the linking column leads are riveted to the side rails 710 of the lead frame 800. The riveted projections 735 are wider than the original projections 734 so that the column lead groups can be strongly linked to the side rail 710.

A pair of column lead groups 755 are riveted to the lead frame for manufacturing one package. In more detail, column lead groups 755 are disposed on opposite sides of the die pad 725 at a specified distance. Thus, when the column lead groups are mechanically connected to the lead frame 800, the die pad 725 does not come into contact mechanically with the column lead group 755.

Figure 39:
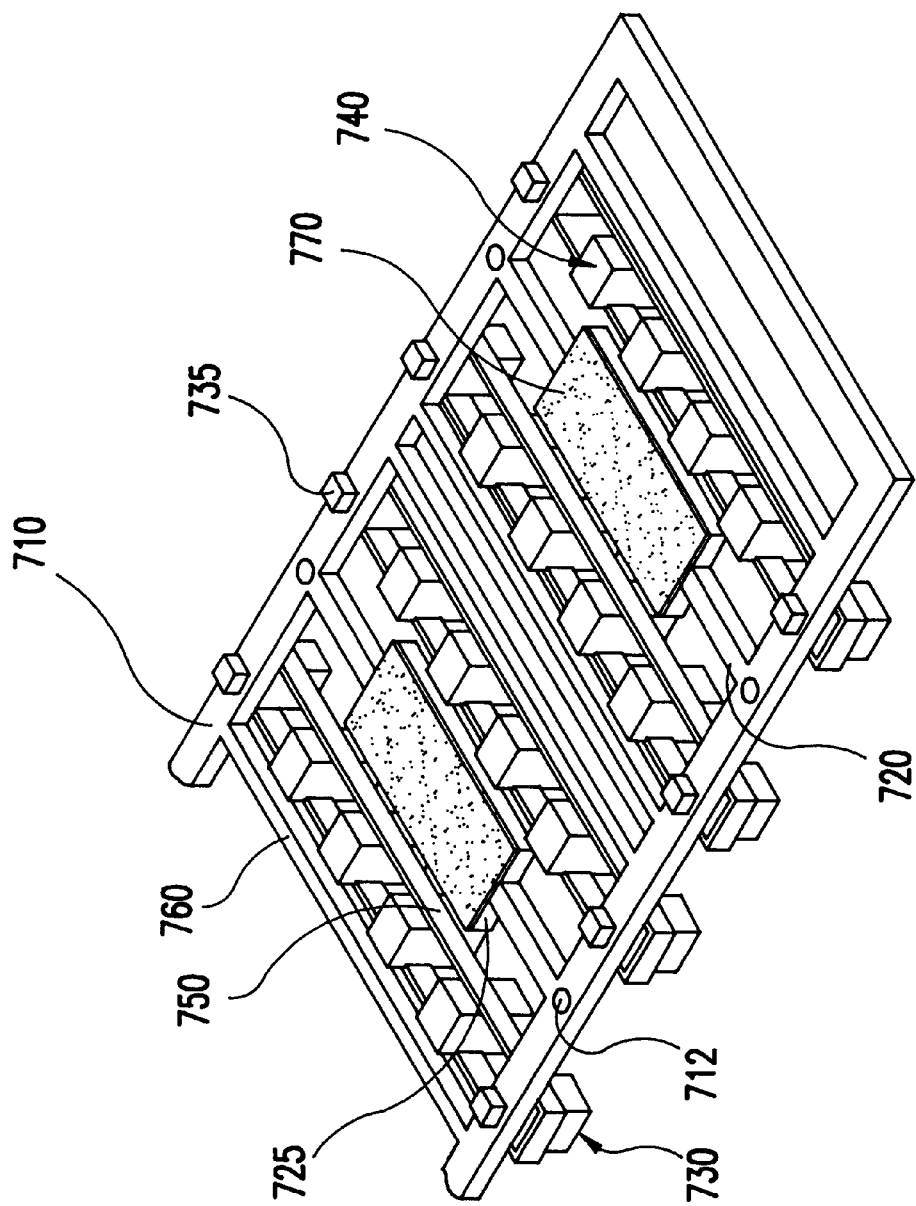
Figure 40:
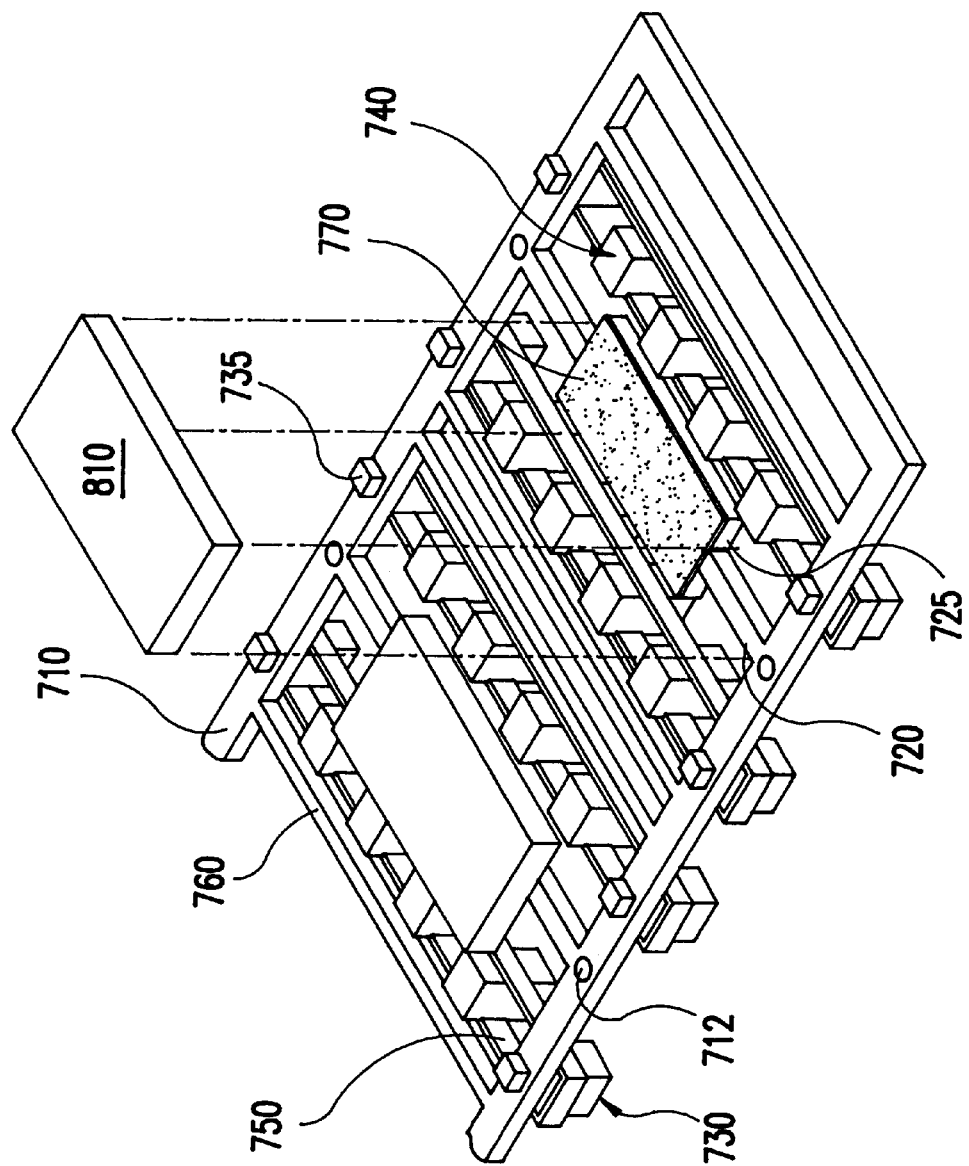
Figure 41:
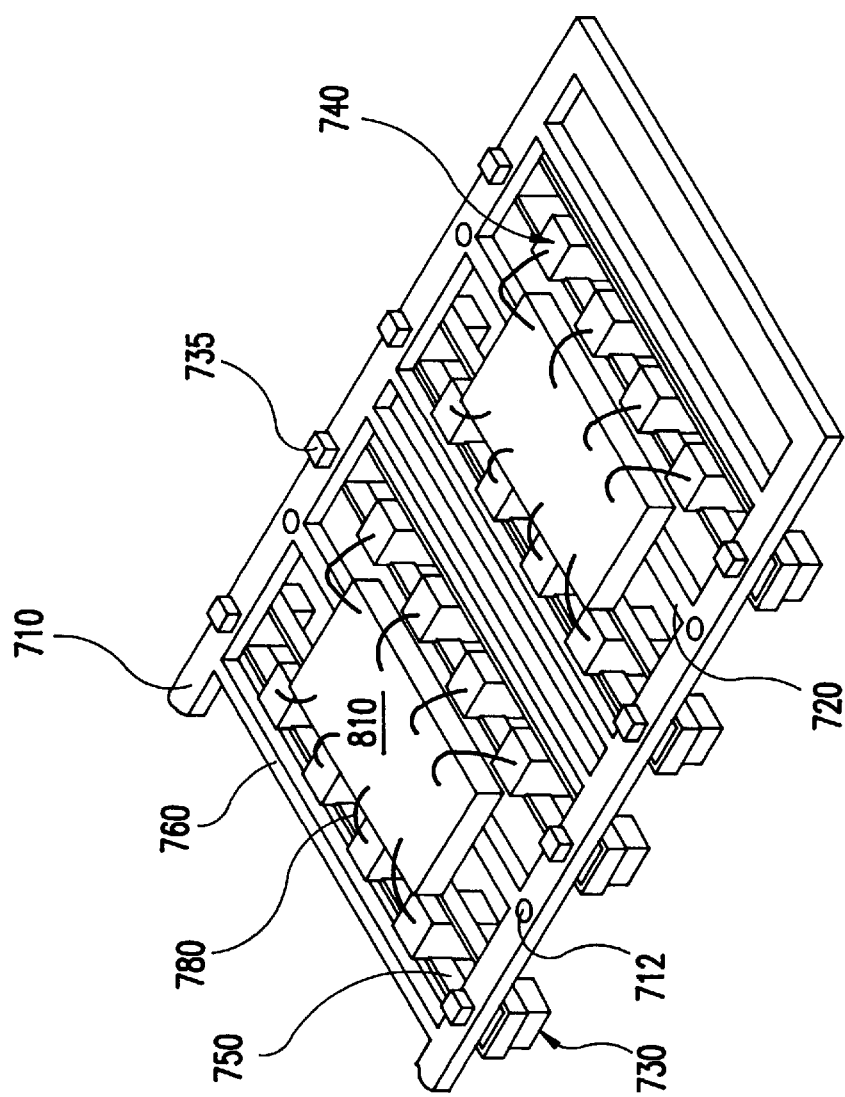
Figure 42:
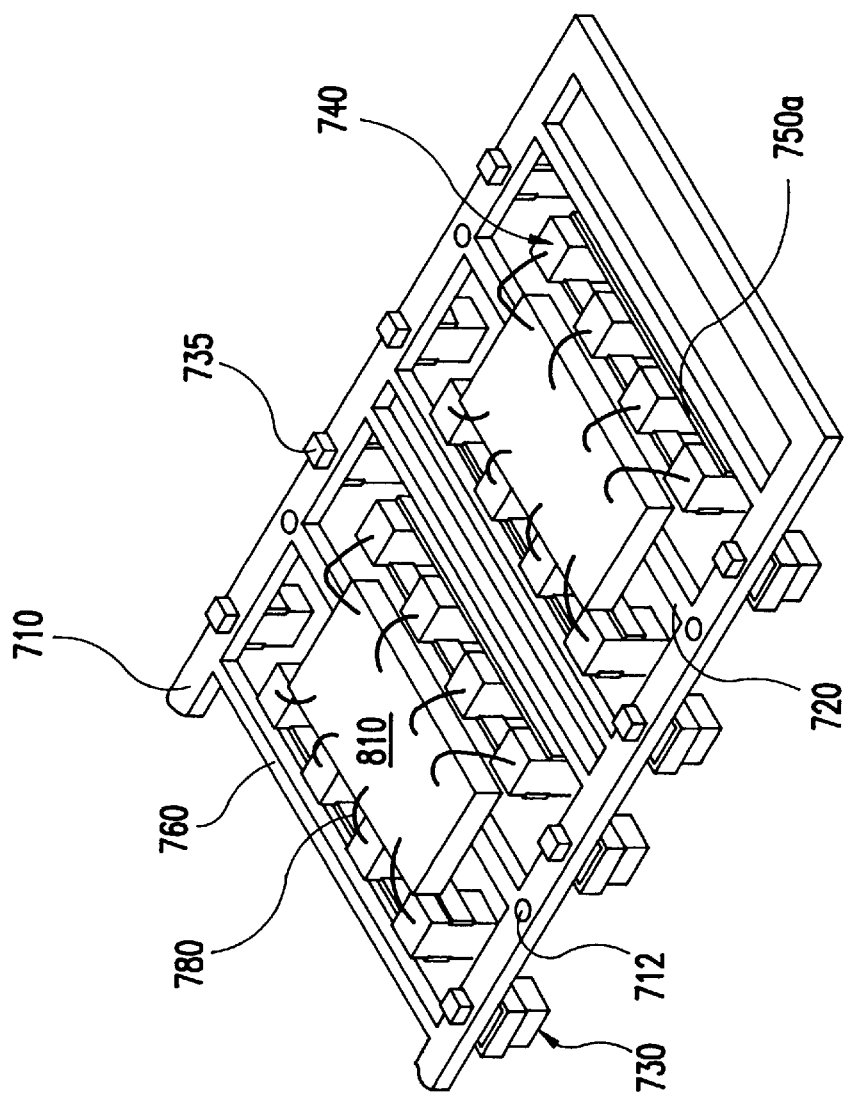
Figure 43:
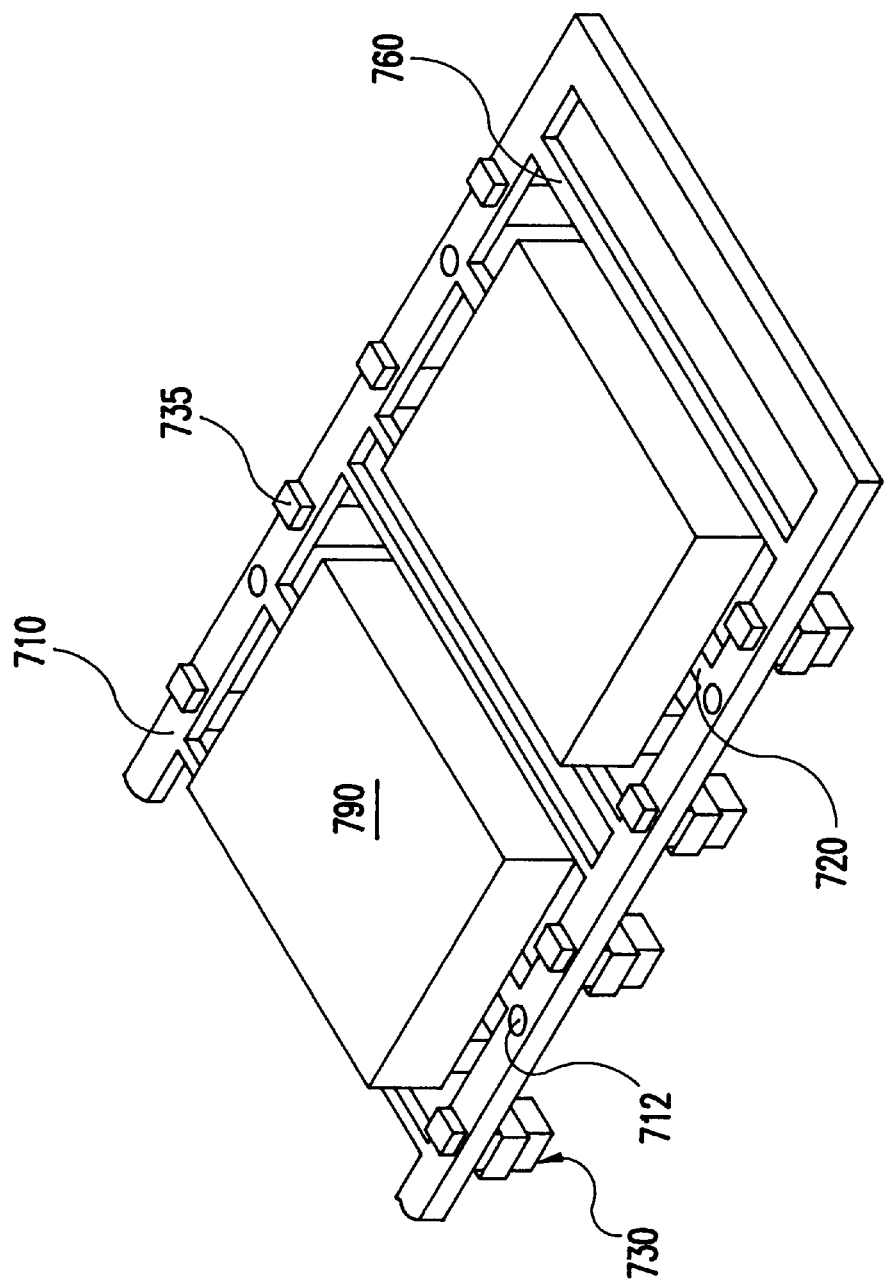
Figure 44:
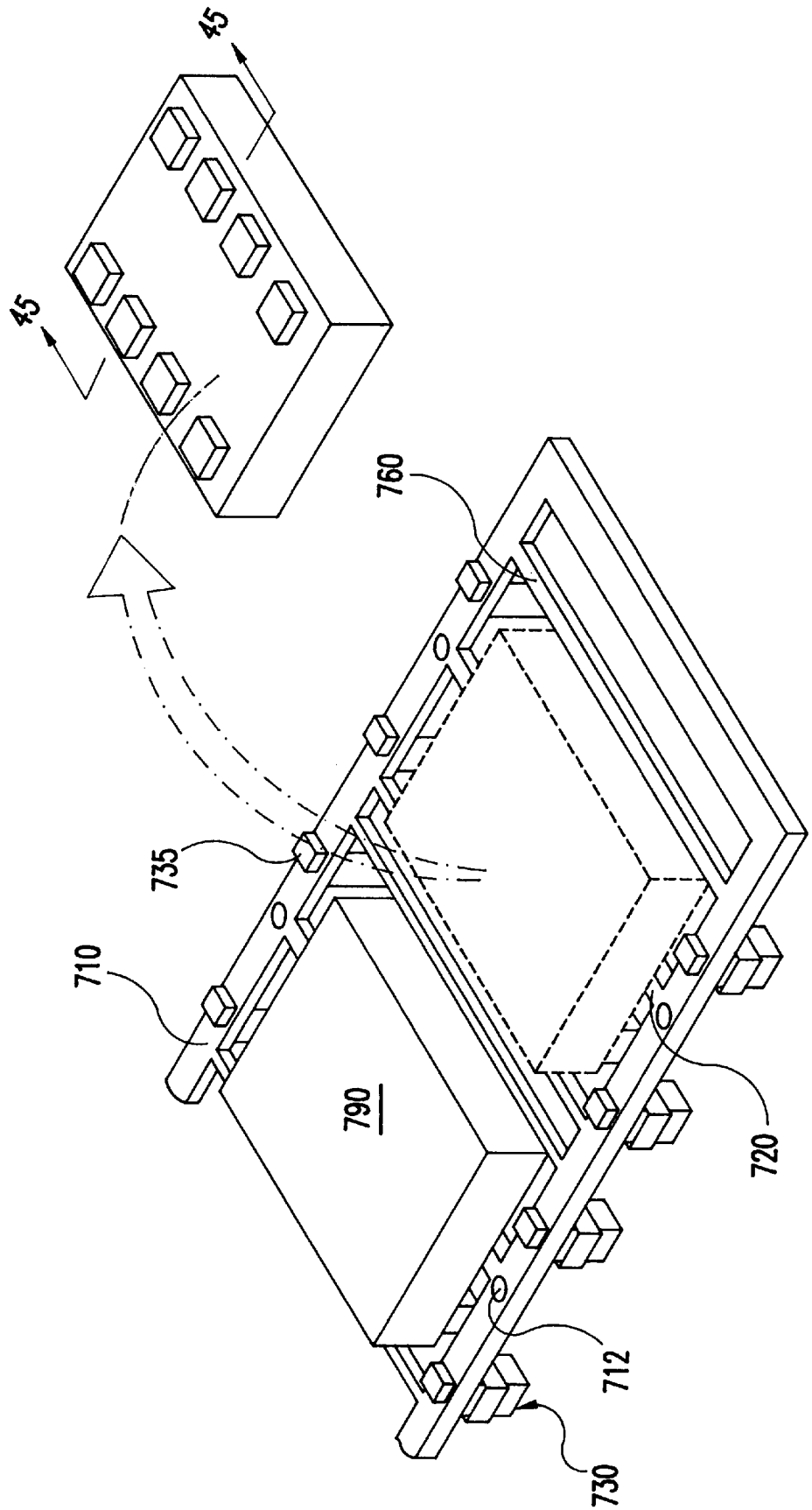
Figure 45:
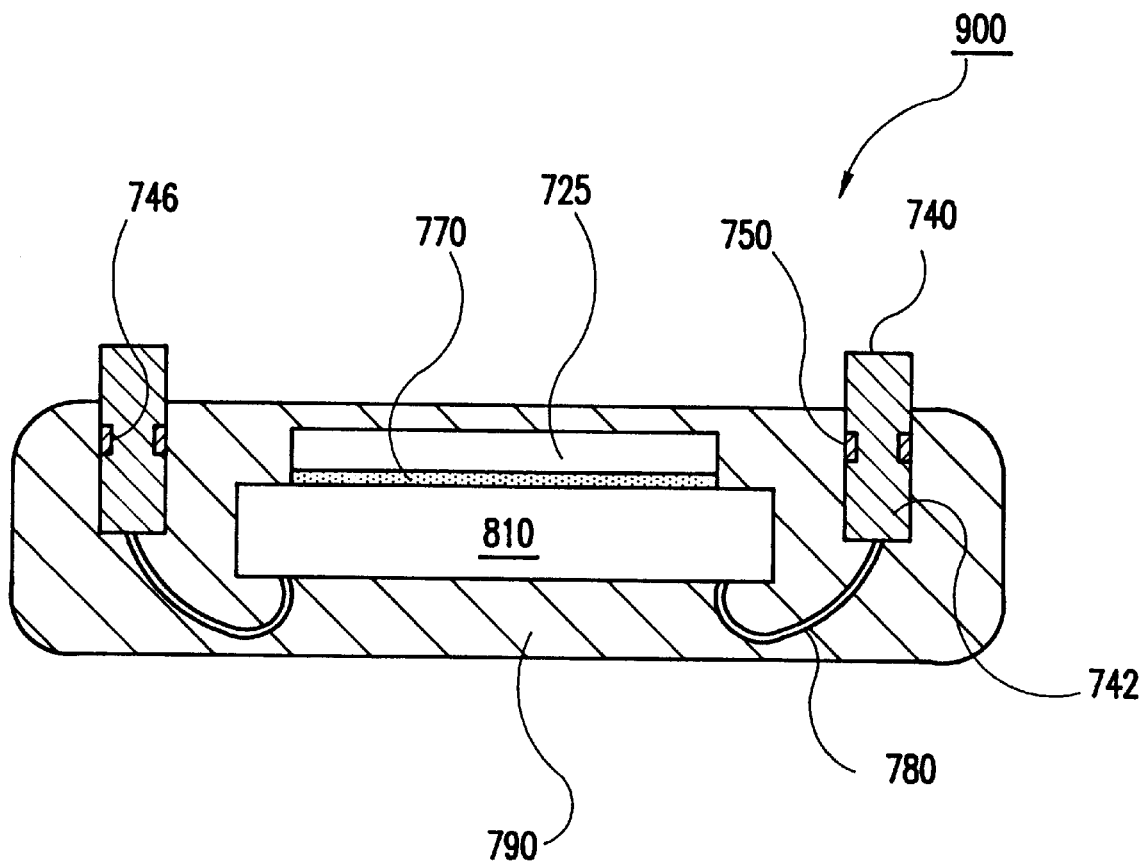

FIG. 39 is a perspective view showing the column lead material in FIG. 37, in which the die pad 725 is coated with an adhesive; FIG. 40 is a perspective view depicting the attachment of a chip 810 to one of the die pads 725; FIG. 41 is a perspective view depicting the electrical connections between the contacting column leads 740 and the chip 810; FIG. 42 is a perspective view showing cutting of the band 750 which ties the linking column leads and contacting column leads together; FIG. 43 shows the structure of the package assembly in FIG. 42 after the molding process is completed; FIG. 44 shows separation of an individual package from the lead frame; and FIG. 45 is a sectional view taken along the line 45—45 in FIG. 44.

With reference to FIGS. 39 through 45, an adhesive, for example Ag-epoxy adhesive 770 is applied onto the upper surface of the die pad 725, and the die pad 725 is attached to the lower surface of the chip 810. The chip is separated from the contacting column leads 740 disposed on opposite sides of the die pad 725 such that electrical connections therebetween can be accomplished via bonding wires 780. The die pad 725 is smaller than the chip 810, and the reason therefor will be described hereinafter.

Then, the bonding pads on opposite peripherals of the upper surface of the chip 810 are electrically connected to a corresponding contacting column leads 740 by way of an electrical connection means such as a bonding wire 780. Then, the band 750 is cut. In detail, the band 750 is cut in order to separate the linking column leads 730, which are now mechanically connected to the through holes 714 in the side rails 710, from the contacting column leads 740. Thus, once the electrical connection is completed, the contacting column leads 740 are supported by bonding wires 780, while before performing the electrical connection, they are mechanically supported by the band 750 which ties them and the linking column leads 730, which are mechanically connected to the side rail 710.

Then, the chip 810, die pad 725, contacting column leads 740, part of tie bars 720, band 750 and electrical connection means including bonding wires 780 are encapsulated with an encapsulant such as a potting resin or an EMC to give a package body 790. The contacting column leads 740 are partially embedded within the encapsulant to a height up to the grooves 746.

The package body 790 is formed between two dam bars 760 and the individual package 900 can be obtained by cutting tie bars 720.

In this embodiment, although only one lead frame is described for simplicity, the same process steps are applied to a lead frame strip having a plurality of lead frame units. Thus, mass production of packages having column leads is possible.

The process described above requires the following:

(1) The through holes in the side rails have an inner diameter greater than the outer diameter of the projections of the linking column leads, so that the projections can be inserted smoothly into the through holes. If the inner diameter of the through holes is the same as or smaller than the outer diameter of the projections, the projections cannot be inserted or may be broken during the insertion.

(2) The die pad is preferably smaller than the chip. The size of the die pad is not important as long as the chip can be attached thereto. Thus, the die pad need not be the same as or larger than the chip. For the present invention, the amount of adhesive employed to attach the chip to the die pad can be decreased and the occurrence of delamination between the chip and the die pad due to moisture absorption of the adhesive during various reliability tests carried out after the assembly of the package can be reduced, by decreasing the size of the die pad. Besides, a die pad which is larger than the chip is not desirable for the present invention which is drawn to reduction in package size.

(3) The chip attached to the die pad should not mechanically contact the column lead group. There should be a sufficient space between the chip and the contacting column lead so as to form a loop of bonding wire. Even if an electrical interconnection by way of a mechanical contact between the chip and contacting column lead is accomplished, this is not preferable because external pressure on the die pad applied during the attachment of the chip to the die pad can cause a displacement of the contacting column leads. This may deteriorate the reliability of the subsequent wire bonding step.

(4) The height of the grooves in the contacting column leads is preferably the same as the thickness of the band. Since the groove in the linking column leads does not remain in the package body, the height of the groove is irrelevant to the thickness of the band. However, for the contacting column leads, the groove remains in the package body, so the height of the groove is preferably the same as the thickness of the band to assure a strong mechanical connection between the band and the contacting column leads. If the thickness of the band is greater than the height (or depth) of the groove, the tied part of the column leads where the band is fit into the groove of the column leads protrudes outward, resulting in a poor mechanical connection and a larger amount of polyimide resin.

The present invention is explained by way of embodiments in which the chip has two opposite rows of four bonding pads. However, many variations and/or modifications can be made without departing from the inventive concepts. The number of column leads is not limited. Further, a chip having bonding pads at its central region is applied to the present invention. For the first and second embodiments, the placement of the die pad and column leads can be changed.

The first and second embodiments can be changed so that a plurality of contacting column leads can be in contact with the chip. All of the embodiments can be applied to multi-chip packages. For example, a plurality of chips are attached to a plurality of die pads, or a plurality of chips are attached to one die pad. The cross-sectional shape of the column leads may be square, pentagonal or circular, as long as the column leads have a three-dimensional column shape.

The invention according to the third embodiment has the following advantages:

(1) The mass production of packages is possible in a simple process without any additional equipment.

(2) The package has short electrical connections so that it can comply with high speed requirements and it can have a small size.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A package for a semiconductor chip including a plurality of column leads, which comprises:
   a chip having a plurality of bonding pads on an upper surface thereof;
   a die pad having a metal layer coated on an upper surface thereof and being bonded to a bottom surface of said chip;
   a plurality of column leads, which are separated from said die pad and have a metal layer formed on an upper surface thereof;
   means for electrically connecting each of said bonding pads to said metal layer formed on a corresponding one of said column leads; and
   an encapsulant covering said chip, die pad, column leads and electrical connection means,
   wherein a bottom portion of each of said column leads and a bottom portion of said die pad extends outward from said encapsulant.

2. The package according to claim 1, wherein said die pad and said column leads are made from identical material.

3. The package according to claim 1, wherein an upper surface of said die pad is coplanar with an upper surface of said column leads.

4. The package according to claim 1, wherein said metal layer on the upper surface of the die pad and said metal layer on the upper surface of the column leads are made from identical material.

5. The package according to claim 3, wherein said metal layer on the upper surface of the die pad and said metal layer on the upper surface of the column leads have an identical thickness.

6. The package according to claim 3, wherein said bottom surface of the die pad extending outward from the package body is coplanar with said bottom surface of the column lead extending outward from the package body.

7. A lead frame for semiconductor packages, which comprises:
   a die pad;
   two parallel side rails on opposite sides of said die pad, each of said side rails being formed with a plurality of index holes and a plurality of through holes;
   tie bars linking said die pad to said side rails;
   column lead groups further comprising a plurality of contacting column leads arranged in a row, a plurality of linking column leads and a band,
   said contacting column leads having horizontal grooves at a middle position of walls thereof,
   said linking column leads being placed at opposite ends of said row of contacting column leads, each of said linking column leads having a projection mechanically linked to a corresponding through hole in said side rails and being formed with horizontal grooves at a middle position of walls thereof, and
   said band being in contact with said grooves of said contacting column leads and said linking column leads thereby connecting said linking column leads and said contacting column leads together; and
   dam bars on opposite sides of said groups of column leads and integral with said side rails.

8. The lead frame according to claim 7, wherein a pair of said column lead groups are fixed to said side rails in such a way that each projection of said linking column leads is fit into and riveted to one of said through holes in said side rails.

9. The lead frame according to claim 7, wherein a depth of said grooves in said linking column leads and said contacting column leads is identical to a thickness of said band.

10. A semiconductor device package having column leads, which comprises:
    a chip having a plurality of bonding pads on an upper surface thereof;
    a die pad bonded to a bottom surface of said chip;
    a plurality of contacting column leads on opposite sides of said die pad, said column leads having horizontal grooves at a middle position of walls thereof;
    bands in contact with said grooves of said contacting column leads for connecting said contacting column leads together;
    means for electrically connecting each of said bonding pads to a corresponding one of said contacting column leads; and
    an encapsulant covering said chip, die pad, contacting column leads, bands and electrical connection means, forming a package body,
    wherein said contacting column leads and said die pad extend outward from said encapsulant.

11. The semiconductor device package according to claim 10, wherein said die pad has a top surface which is smaller than said bottom surface of said chip.

12. The semiconductor device package according to claim 10, wherein a depth of said grooves in said contacting column leads is identical to a thickness of said band.

13. The semiconductor device package according to claim 10, wherein said grooves in said contacting column leads are embedded within said package body.

* * * * *